United States Patent
Tsujimoto

(10) Patent No.: US 9,739,812 B2
(45) Date of Patent: Aug. 22, 2017

(54) SENSOR ELEMENT WITH TEMPERATURE COMPENSATING FUNCTION, AND MAGNETIC SENSOR AND ELECTRIC POWER MEASURING DEVICE WHICH USE SAME

(71) Applicant: SIRC Co., LTD, Osaka (JP)

(72) Inventor: Hiroaki Tsujimoto, Osaka (JP)

(73) Assignee: SIRC CO., LTD, Osaka (JP)

( * ) Notice: Subject to any disclaimer, the term of this patent is extended or adjusted under 35 U.S.C. 154(b) by 19 days.

(21) Appl. No.: 14/781,418

(22) PCT Filed: Apr. 1, 2014

(86) PCT No.: PCT/JP2014/001905
§ 371 (c)(1),
(2) Date: Sep. 30, 2015

(87) PCT Pub. No.: WO2014/162730
PCT Pub. Date: Oct. 9, 2014

(65) Prior Publication Data
US 2016/0041209 A1 Feb. 11, 2016

(30) Foreign Application Priority Data
Apr. 1, 2013 (JP) .................... 2013-076469

(51) Int. Cl.
*G01R 21/08* (2006.01)
*G01R 33/09* (2006.01)
*H01L 43/08* (2006.01)

(52) U.S. Cl.
CPC .......... *G01R 21/08* (2013.01); *G01R 33/093* (2013.01); *H01L 43/08* (2013.01)

(58) Field of Classification Search
CPC ........ G01R 21/08; G01R 33/093; H01L 43/08
(Continued)

(56) References Cited

U.S. PATENT DOCUMENTS 5,117,319 A * 5/1992 Tokunaga ............... G01D 5/145
257/E43.004
5,780,176 A * 7/1998 Iwasaki ................... B82Y 10/00
257/E43.004
(Continued)

FOREIGN PATENT DOCUMENTS

| CN | 1396436 A | 2/2003 |
| JP | H0777565 A | 3/1995 |

(Continued)

OTHER PUBLICATIONS

International Search Report dated Jul. 8, 2014 for PCT Application No. PCT/JP2014/001905.
(Continued)

*Primary Examiner* — Billy Lactaoen
(74) *Attorney, Agent, or Firm* — EIP US LLP

(57) ABSTRACT

A magnetoresistance effect type magnetic sensor has a problem in that the increase in the surrounding temperature decreases the magnetic characteristic of a magnetic film itself and thereby decreases the sensitivity of the sensor. A sensor element includes: a magnetic film having magnetoresistance effect; a pair of electrodes for applying an electric current to the magnetic film, the pair of electrodes being opposed across the magnetic film; a longitudinal bias magnetic field addition magnet to generate a first bias magnetic field in an opposing direction of the electrodes; and a lateral bias magnetic field addition magnet to generate a second bias magnetic field in an orthogonal direction to the longitudinal bias magnetic field addition magnet, in which a temperature characteristic of the longitudinal bias magnetic field addition magnet is higher than a temperature characteristic of the lateral bias magnetic field addition magnet.

10 Claims, 20 Drawing Sheets

(58) Field of Classification Search
USPC .......................................................... 324/228
See application file for complete search history.

(56) References Cited

U.S. PATENT DOCUMENTS

| | | | |
|---|---|---|---|
| 6,270,588 B1 | 8/2001 | Takano et al. | |
| 6,395,388 B1* | 5/2002 | Iwasaki | B82Y 10/00 |
| | | | 257/E43.004 |
| 2003/0013507 A1 | 1/2003 | Sato | |
| 2007/0222441 A1 | 9/2007 | Satoh | |
| 2014/0049253 A1* | 2/2014 | Tsujimoto | G01R 21/08 |
| | | | 324/228 |

FOREIGN PATENT DOCUMENTS

| | | |
|---|---|---|
| JP | 2005049262 | 2/2005 |
| WO | 2012105459 A1 | 8/2012 |

OTHER PUBLICATIONS

Tsujimoto, et al.: "Thin film power meter using magnetic thin film", The Institute of Electrical Engineers of Japan Magnetics Kenkyukai Shiryo, 2005, vol. MAG-05, No. 174-196 (No. 182), pp. 45-48.
Tsujimoto et al.: "Magnetic thin film power sensor using a magneto resistance effect", The Institute of Electrical Engineers of Japan Magnetics Kenkyukai Shiryo, Nov. 24, 2011, vol. MAG-11, No. 91-104, 106-112, 114 (No. 96), pp. 27-32.

* cited by examiner (a)

(b)

(a)

(b)

(a)

(b)

(a)

(b)

(a)

(b)

(a)

(b)

(a)

(b)

Hob=25[Oe]
φ=35[°]

Hob=25[Oe]
φ=45[°]

Hob=25[Oe]
φ=55[°]

SENSOR ELEMENT WITH TEMPERATURE COMPENSATING FUNCTION, AND MAGNETIC SENSOR AND ELECTRIC POWER MEASURING DEVICE WHICH USE SAME

CROSS REFERENCE TO RELATED APPLICATIONS

This application is a National Phase Entry of International Application No. PCT/JP2014/001905, filed Apr. 1, 2014, which claims priority to Japanese Application No. 2013-076469, filed Apr. 1, 2013. Each of the above-referenced patent applications is incorporated by reference in its entirety.

TECHNICAL FIELD

The present invention relates to a sensor element to which a temperature compensating function is added, and a magnetic sensor and an electric power measuring device which use same.

BACKGROUND ART

It is predicted that the usage of compact magnetic sensors will expand increasingly. Particularly, it is thought that an electric power measuring device is an essential device in the case of intending to utilize electric energy from fossil fuel. Patent Literature 1 discloses an electric power measuring device that connects a magnetic sensor and a sensor resistance in series, installs the magnetic sensor and the sensor resistance so as to be parallel to a load in an electric circuit and further to be adjacent to a wire of the electric circuit, and thereby, can measure the consumed electric power in the load.

Such an electric power measuring device can be formed such that the size is mostly the size of a magnetic thin film, and therefore, can be made such that the element, as a whole, has a size of approximately several millimeters square. Therefore, by installing the device at each of various spots in a large-scale system, it is possible to minutely monitor the consumed electric power.

Meanwhile, as the usage expands, there is a possibility that an intended use environment is a harsh environment. Particularly, it is known that magnetic characteristics change depending on temperature, and for the accuracy enhancement of the sensor sensitivity, temperature compensation is an indispensable technology for the magnetic sensor.

In view of this problem, Patent Literature 2 discloses a technology in which the magnetoresistance effects in different temperature environments have a predetermined relation to a magnetic field to be applied and thereby a constant temperature compensation becomes possible.

Among magnetic sensors utilizing magnetism, a magnetic sensor utilizing the magnetoresistance effect is particularly referred to as a magnetoresistance effect type magnetic sensor. The magnetoresistance effect type magnetic sensor detects the magnitude of a measurement-target magnetic field given in the orthogonal direction to a direction in which an electric current flows. Then, a magnetic field to be previously given in the same direction as the measurement-target magnetic field for the detection is referred to as a bias magnetic field.

Patent Literature 2 mentions the relation between the magnitude of the bias magnetic field and the magnetoresistance effect. However, as for the bias magnetic field in Patent Literature 2, the magnetic field to be given to the magnetic sensor decreases when a concave part of a rotor of a measurement object comes close, and the magnetic field to be given to the magnetic sensor increases when a convex part comes close. That is, the bias magnetic field mentioned in Patent Literature 2 is virtually the applied magnetic field (measurement-target magnetic field) for the magnetic sensor, and is not the bias magnetic field for determining the operating point of the magnetic sensor.

CITATION LIST

Patent Literature

Patent Literature 1: WO2012/105459
Patent Literature 2: Japanese Patent Laid-Open No. 2005-049262

SUMMARY OF INVENTION

Technical Problem

The magnetoresistance effect type magnetic sensor requires the solution of the following problem: the increase in the surrounding temperature decreases the magnetic characteristic of the magnetic film itself and thereby decreases the sensitivity of the sensor. Typically, this is performed by a temperature compensation circuit. However, in the temperature compensation circuit, it is necessary to obtain the temperature information of spots where the magnetic sensors are provided, and it is necessary to attach some sort of temperature sensors at the installation spots of the magnetic sensors.

This leads to the increase in the size of the device and the increase in the labor for the installation. Temperature compensation (autonomous compensation) means for allowing the magnetic sensor itself to cancel a temperature change is needed for magnetic sensors including the magnetoresistance effect type magnetic sensor.

Solution to Problem

The present invention, which has been conceived in view of the above problem, adds a temperature compensating function to a sensor element constituting a magnetic sensor. More specifically, a sensor element according to the present invention includes:
a magnetic film having magnetoresistance effect;
a pair of electrodes for applying an electric current to the magnetic film, the pair of electrodes being opposed across the magnetic film;
a longitudinal bias magnetic field addition magnet to generate a first bias magnetic field in an opposing direction of the electrodes; and
a lateral bias magnetic field addition magnet to generate a second bias magnetic field in an orthogonal direction to the longitudinal bias magnetic field addition magnet,
in which a temperature characteristic of the longitudinal bias magnetic field addition magnet is higher than a temperature characteristic of the lateral bias magnetic field addition magnet.

Further, a sensor element according to the present invention includes:
a magnetic film having magnetoresistance effect;
a pair of electrodes for applying an electric current to the magnetic film, the pair of electrodes being opposed across the magnetic film; and a oblique bias magnetic field addition magnet to generate a bias magnetic field in a oblique direction to a longitudinal direction of the magnetic film, the oblique bias magnetic field addition magnet having a temperature characteristic.

Further, a magnetic sensor according to the present invention uses the above sensor element. Specifically, the magnetic sensor according to the present invention includes:

the above sensor element;

a current source to apply an electric current between both end electrodes of the sensor element; and a voltmeter to measure a voltage between both the end electrodes of the sensor element.

Further, an electric power measuring device according to the present invention uses the above sensor element, and more specifically, is an electric power measuring device to measure an electric power in a circuit in which a power source and a load are connected by a connecting wire, the electric power being consumed in the load, the electric power measuring device including:

the above sensor element arranged adjacent to the connecting wire;

a voltmeter to measure a voltage between both ends of the sensor element;

a sensor resistance having one end connected with one end of the sensor element; and a first connecting terminal and a second connecting terminal for connecting the sensor element in parallel with the load with respect to the power source, the first connecting terminal being provided at the other end of the sensor element, the second connecting terminal being provided at the other end of the sensor resistance.

Advantageous Effects of Invention

In the sensor element according to the present invention, the longitudinal bias magnetic field to suppress the magnetoresistance effect is previously applied to the element. Then, the longitudinal bias magnetic field addition magnet has a temperature characteristic similarly to the magnetic film, and acts such that the longitudinal bias magnetic field decreases with the rise in temperature. As a result, for the magnetoresistance effect of the magnetic film, the temperature rise decreases the sensitivity, but decreases also the longitudinal bias that is a suppression factor, and therefore, it is possible to maintain the sensitivity.

Further, in the sensor element according to the present invention, not only the magnetoresistance effect of the magnetic film and the temperature characteristic of the longitudinal bias magnetic field cancel each other out, but also the magnetoresistance effect, the longitudinal bias magnetic field and the lateral bias magnetic field cancel each other out, and thereby, it is possible to suppress the change in the sensitivity due to the temperature more minutely.

Particularly, in the sensor element utilizing the oblique bias magnetic field, the magnetic film can be made using only the magnetic film, and therefore, there are effects that the impedance can be increased, that the making is simplified, and that the sensitivity can be regulated by the angle to the oblique bias magnetic field.

Further, the magnetic sensor and electric power measuring device using this magnetic sensor can maintain the accuracy of the sensitivity, even under a harsh temperature change, and contribute to the construction of a reliable system.

DESCRIPTION OF EMBODIMENTS

Figure 1:
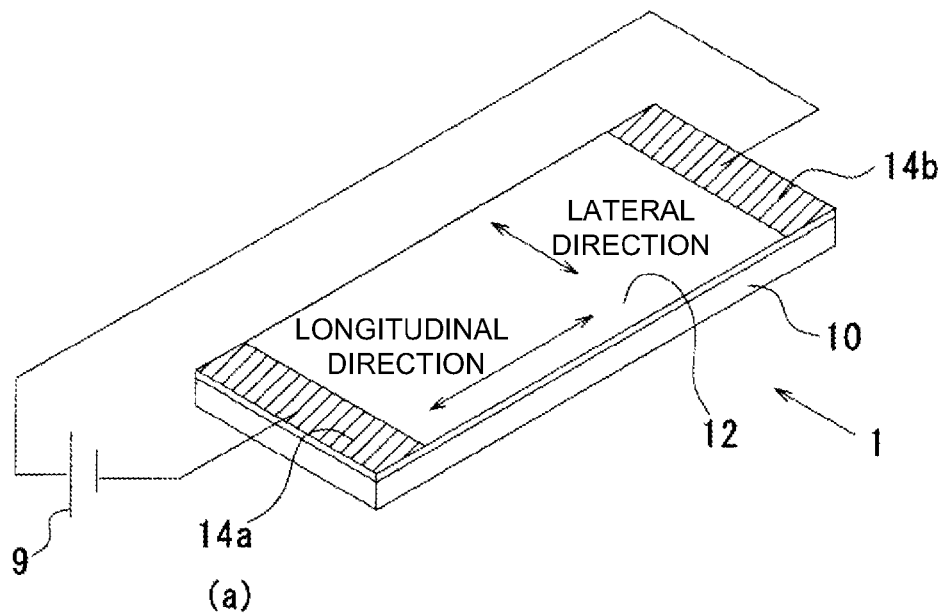
FIG. 1 are diagrams illustrating the configuration of a sensor element and the magnetoresistance effect.
Figure 1:
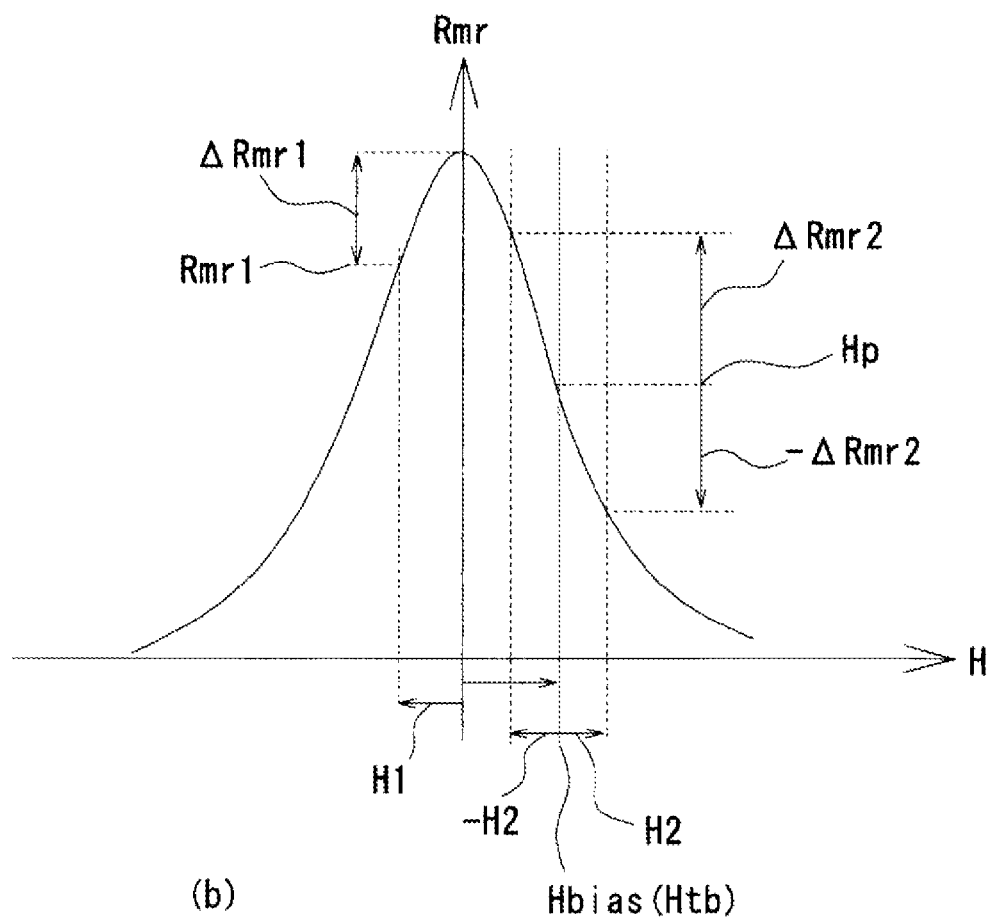

First, the principle of a sensor element in the present invention will be described, and next, a specific configuration and the like will be described. FIG. 1, first, show the principle of a magnetic sensor 1 utilizing a magnetoresistance effect. With reference to FIG. 1(a), a magnetic film 12 provided on a substrate 10 is formed in a strip shape. At both ends, electrodes 14a, 14b are provided. Between the opposing electrodes 14a, 14b, an electric current flows by a power source 9. The direction between the opposing electrodes 14a, 14b, or the longer direction of the strip is referred to as the "longitudinal direction". Further, the direction orthogonal to the longitudinal direction is referred to as the "lateral direction". In the case where the magnetic film 12 has a strip shape, the "lateral direction" is the width direction of the strip.

Here, in the present invention, the magnetic film 12 not only may be a film-shaped magnetic substance formed by a film formation method, but also may be a bulk material if allowing for the discrimination between the longitudinal direction and the lateral direction. That is, the cross section may be a circle, or may be a square.

In the strip-shaped magnetic sensor 1, when a magnetic field H is applied from the lateral direction, a resistance value Rmr between the electrodes 14a, 14b changes. This is referred to as the magnetoresistance effect, and a sensor using the magnetoresistance effect is referred to as a magnetoresistance effect type magnetic sensor. FIG. 1(b) illustrates the magnetoresistance effect as a graph. The abscissa indicates the intensity of the magnetic field H given from the lateral direction, and the ordinate indicates the resistance value Rmr in the longitudinal direction of the magnetic film 12.

With reference to the left half of the graph of FIG. 1(b), as is well known, in the magnetoresistance effect, when the magnetic field H from the lateral direction increases (H1), the resistance value Rmr (Rmr1) in the longitudinal direction of the magnetic film 12 decreases. Here, although there are increases in some cases, the description is made assuming that the resistance value Rmr decreases with the increase in the magnetic field H in the lateral direction.

With respect to the magnetic field H from the lateral direction, the magnetoresistance effect type magnetic sensor produces a resistance value change amount ΔRmr (ΔRmr1) that is equivalent regardless of the orientation. That is, even when the magnetic field H is applied from the right to the left in the lateral direction, or even when the magnetic field H is applied from the left to the right, the resistance value change amount ΔRmr is equivalent. That is, the magnetoresistance effect has the characteristic of an even function, with respect to the magnetic field H to be given from the lateral direction.

However, in this state, the magnetic sensor 1 cannot detect the information relevant to the orientation of the magnetic field H. Hence, with reference to the right half of the graph of FIG. 1(b), a certain degree of bias magnetic field Hbias is given in the lateral direction. This is referred to as a lateral bias magnetic field Htb. The lateral bias magnetic field Htb shifts an operating point Hp of the magnetoresistance effect along the inclined part of the even function, and therefore, the magnetic sensor 1 can detect even the information (ΔRmr2, −ΔRmr2) about the resistance value change amount in the orientation of the applied magnetic field H, such as whether the orientation is the same orientation (H2) as the bias magnetic field Hbias or the reverse orientation (−H2).

Here, suppose that the temperature of the magnetic film 12 increases. Generally, magnetic substances lose the magnetism at the Curie temperature. Then, in magnetic substances, magnetic characteristics such as saturation magnetization and coercive force decrease as the temperature rises up to the Curie temperature. It is thought that the magnetoresistance effect is related to the magnetization of the magnetic film 12, and therefore, the rise in the temperature decreases the magnetoresistance effect.

FIG. 2(a) shows the temperature change in the magnetoresistance effect. Only the right half of a graph illustrating the magnetoresistance effect is shown. The abscissa indicates the magnetic field H from the lateral direction, and the ordinate indicates the resistance value Rmr in the longitudinal direction of the magnetic film 12. As the temperature changes from a low temperature t0 to a high temperature t2, the characteristic curve changes from a steep mountain shape to a broad mountain shape. When the lateral bias magnetic field Htb does not change, a dynamic range S of the magnetic sensor 1 decreases from S0 to S2, with the rise in the temperature. That is, the sensitivity decreases.

By the way, the magnetic field Hbias to be given in the longitudinal direction of the magnetic film 12 is referred to as a longitudinal bias magnetic field Hob. When the longitudinal bias magnetic field Hob is applied to the magnetic film 12, the magnetoresistance effect is suppressed as the longitudinal bias magnetic field Hob increases.

FIG. 2(b) shows the magnetoresistance effect when the longitudinal bias magnetic field Hob is changed. The abscissa indicates the magnetic field H in the lateral direction, and the ordinate indicates the resistance value Rmr in the longitudinal direction of the magnetic film 12. When the longitudinal bias magnetic field Hob increases from Hob0 to Hob2, the magnetoresistance effect changes from a steep mountain shape to a broad mountain shape. That is, the sensitivity of the magnetic sensor 1 decreases from S0 to S2.

It is thought that the magnetoresistance effect depends on the orientation of the magnetization of the magnetic film 12 and the orientation of the electric current. The longitudinal bias magnetic field Hob acts so as to restrict the magnetization of the magnetic film 12 to the longitudinal direction. Therefore, it is thought that the direction of the magnetization is unlikely to change due to the magnetic field H applied from the lateral direction, and as a result, the magnetoresistance effect is suppressed.

When the longitudinal bias magnetic field Hob is applied by a magnet having a temperature characteristic, the rise in the surrounding temperature decreases the longitudinal bias magnetic field Hob. This is because the magnet itself generating the longitudinal bias magnetic field Hob reduces the magnetic characteristic with the rise in the temperature. That is, the dynamic range S of the magnetoresistance effect increases.

Hence, by combining the magnetic film 12 whose sensitivity decreases with the rise in the temperature and the longitudinal bias magnetic field Hob that can increase the sensitivity with the rise in the temperature, it is possible to perform the temperature compensation of the magnetic sensor 1.

Figure 3:
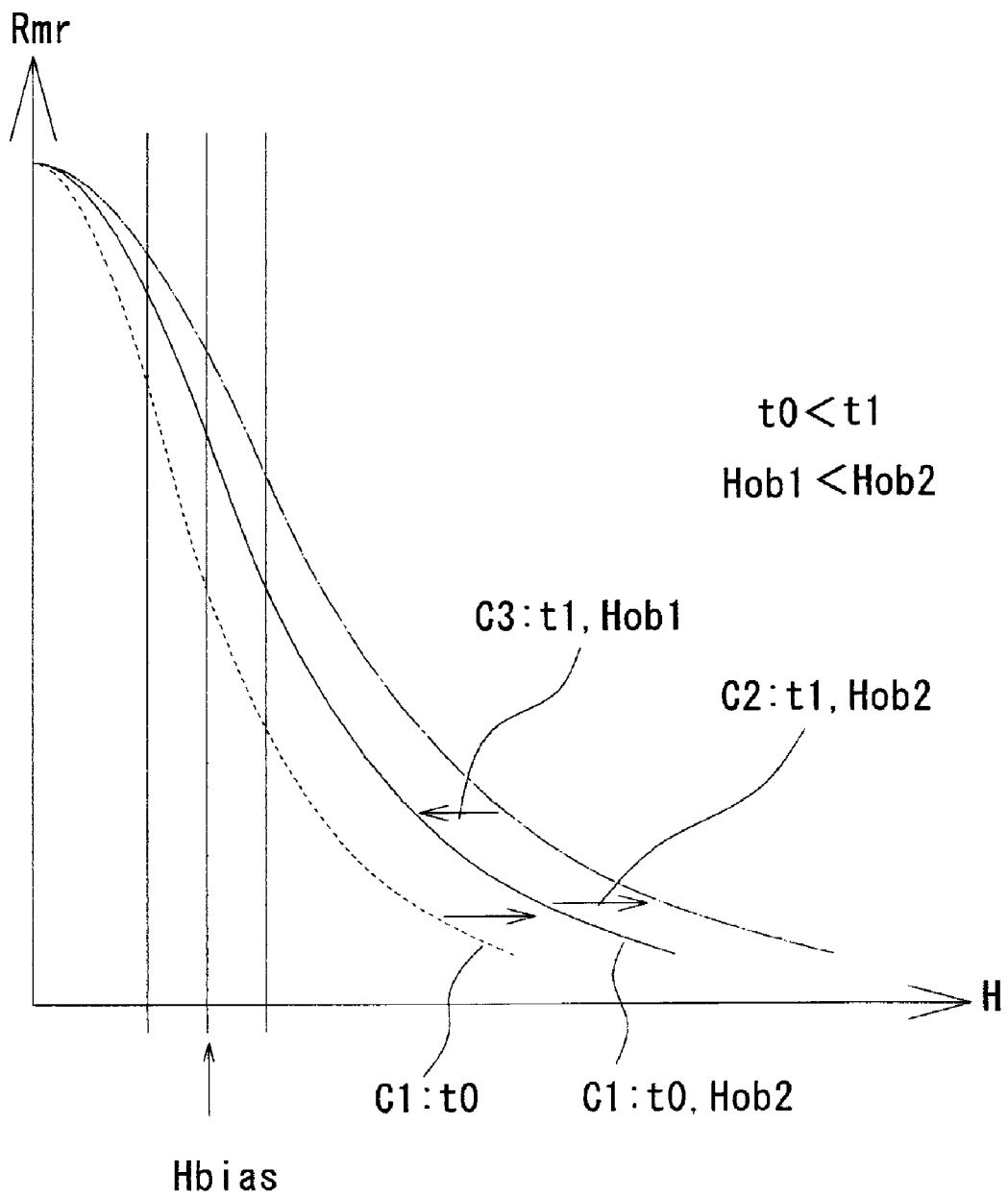
FIG. 3 is a diagram for describing the principle of a temperature compensation of a sensor element according to the present invention.

Refer to FIG. 3. FIG. 3 shows only the half of the magnetoresistance effect. At the time of a temperature t0, a longitudinal bias magnetic field Hob2 is previously applied to the magnetic film 12 having a magnetoresistance effect of C1, such that the magnetoresistance effect has a broad mountain shape C1. When the temperature of the magnetic sensor 1 increases to t1, the magnetoresistance effect tries to become further broader due to the characteristic of the magnetic film 12 (C2). However, on this occasion, the longitudinal bias magnetic field also decreases from Hob2 to Hob1, in response to the temperature rise, and therefore, the magnetoresistance effect returns to a steep mountain shape (C3). That is, even when the temperature changes, the magnetoresistance effect does not change.

Here, it is important that the lateral bias magnetic field Htb (Hbias) needs to be nearly constant against the change in the magnetic film 12 and the longitudinal bias magnetic field Hob. That is, the longitudinal bias magnetic field Hob has a higher temperature characteristic than that of the lateral bias magnetic field Htb.

Embodiment 1

Figure 4:
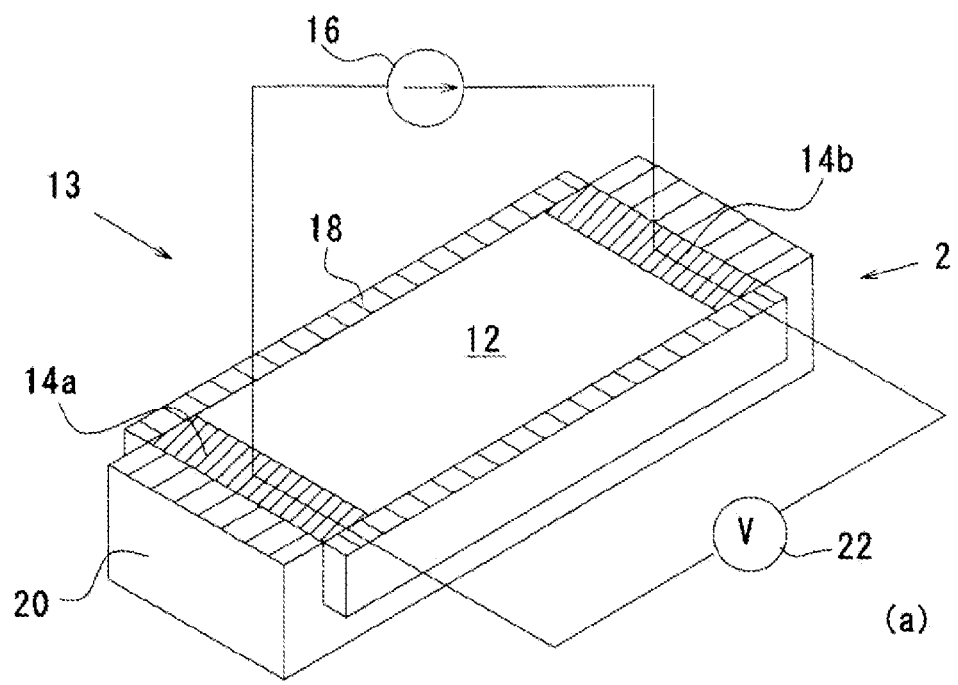
FIG. 4 are diagrams showing the configuration of a sensor element according to the present invention.
Figure 4:
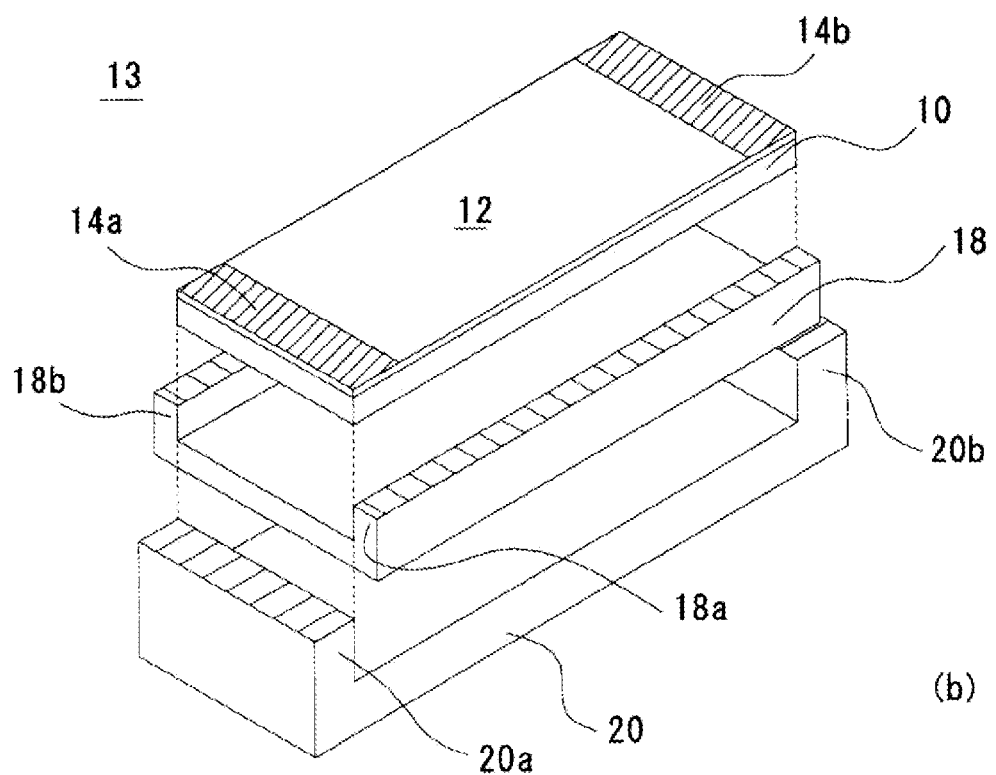

Next, with reference to FIG. 4, the configuration of a magnetic sensor with the temperature compensating function based on the principle will be shown. FIG. 4(a) shows the configuration of a magnetic sensor 2 with the temperature compensating function, and FIG. 4(b) shows an assembly diagram of a sensor element 13. The magnetic sensor 2 with the temperature compensating function includes the strip-shaped magnetic film 12 formed on the substrate 10, the electrodes 14a, 14b provided at both ends of the magnetic film 12, a current source 16 to apply an electric current between the electrodes 14a, 14b, a lateral bias magnetic field addition magnet 18, a longitudinal bias magnetic field addition magnet 20, and a voltmeter 22 to measure the voltage between the electrodes 14a, 14b.

The magnetic film 12 may be formed on the substrate 10 of glass, ceramics or the like. The material is not particularly limited, if the material exerts the magnetoresistance effect. The size can be altered depending on the spot where the magnetic film 12 is installed as a magnetic sensor. For example, in the case of the use on a circuit board, the magnetic film 12 may be incorporated on the circuit board or in the circuit board, together with a circuit pattern.

It is preferable that the shape be a strip shape. This is because, in the magnetoresistance effect, the sensitivity increases depending on the distance (resistance value) over which the electric current flows, and therefore, it is preferable to have a certain degree of length in the electric-current flowing direction (longitudinal direction) while it is allowable to be short in the direction (lateral direction) orthogonal to the electric-current flowing direction. Here, the shape may be a zigzag shape in which strip shapes are folded and are joined in series, if the shape is long in the electric-current flowing direction.

It is preferable that the electrodes 14a, 14b be composed of a material having a higher electric conductivity than that of the magnetic film 12. For example, a good electrically-conductive substance such as copper, aluminum, silver or gold, or an alloy of them can be suitably used. Here, the electrodes 14a, 14b may be also formed of the magnetic film 12.

The current source 16 is a power source for applying the electric current to the magnetic film 12. This is for applying the electric current and detecting the voltage between both ends of the magnetic film 12, because the electric resistance value changes in the magnetoresistance effect. The current source 16 may be a constant voltage source, or may be a constant current source. The current source 16 is connected with both electrodes 14a, 14b of the magnetic film 12, and applies the electric current in the longitudinal direction of the magnetic film 12.

The lateral bias magnetic field addition magnet 18 is a magnet to apply the lateral bias magnetic field Htb in the lateral direction (the orthogonal direction to the electric-current flowing direction) of the magnetic film 12. A C-shaped permanent magnet including magnetic poles 18a, 18b in the lateral direction of the magnetic film 12 can be suitably used. The magnetic field intensity of the permanent magnet is previously adjusted to the magnitude of the lateral bias magnetic field Htb that corresponds to the magnitude of the magnetoresistance effect of the magnetic film 12. More specifically, it is possible to adjust the magnetic field to be generated, by changing the composition of the permanent magnet. Further, the adjustment can also be made by a method of reducing the volume such as a method of decreasing the thickness. Needless to say, the methods may be used concurrently.

Here, the lateral bias magnetic field addition magnet 18 only needs to magnetize the magnetic film 12 in the longitudinal direction and change the orientation of the electric current flowing through the magnetic film 12. Therefore, the lateral bias magnetic field addition magnet 18 may be a permanent magnet, or may be an electromagnet. Further, the lateral bias magnetic field addition magnet 18 may have a structure capable of making a situation in which the lateral bias magnetic field Htb is virtually applied, by the pattern formation on the magnetic film 12. That is, the lateral bias magnetic field addition magnet 18 includes configurations other than magnetic field generation sources. However, it is necessary to have a lower temperature characteristic than that of the longitudinal bias magnetic field addition magnet 20 described later.

In the case of having a low temperature characteristic, the magnetic field intensity does not change due to the change in the temperature. For example, there are a permanent magnet having a low temperature characteristic in a temperature range to be used, an electromagnet connected with a constant current source, a structure capable of making a situation in which the lateral bias magnetic field Htb is applied, and the like.

Particularly, in the structure capable of making a situation in which the lateral bias magnetic field Htb is applied, the temperature characteristic is zero, and the space for the lateral bias magnetic field addition magnet 18 may be small, allowing for a suitable use. A specific structure is a barber pole structure introduced in Patent Literature 1, and the detail will be described later.

The longitudinal bias magnetic field addition magnet 20 is a magnet to add a magnetic field in the longitudinal direction of the magnetic film 12. In FIG. 4, the longitudinal bias magnetic field addition magnet 20 is a C-shaped magnet including magnetic poles 20a, 20b at the outer sides of the electrodes 14a, 14b. The longitudinal bias magnetic field addition magnet 20 needs to change together with the temperature characteristic of the magnetic film 12. Therefore, it is preferable that the longitudinal bias magnetic field addition magnet 20 have a temperature characteristic that is equivalent to or higher than that of the magnetic film 12.

Typically, the temperature characteristic of a bulk magnetic substance is low, and the bulk magnetic substance often loses the magnetization near the Curie temperature drastically. However, since the magnetoresistance effect itself changes by approximately several percent, the compensation for the minimal change in the magnetic characteristic of the magnetic film 12 is necessary, and the longitudinal bias magnetic field Hob itself needs to change a generated magnetic field of approximately several tens of Oe by approximately several tens of Oe. Therefore, it is preferable to use a permanent magnet or the like having a high temperature characteristic for a relatively low output magnetic field.

For example, by the changing of the composition ratio of ferrite, the mixing with an additive or the like, it is possible to suitably use a temperature-sensitive magnetic substance that allows for a change of several Oe/° C. Further, multiple kinds of temperature-sensitive magnetic substances may be used. At least the magnetic film 12, the lateral bias magnetic field addition magnet 18 and the longitudinal bias magnetic field addition magnet 20 are collectively referred to as the sensor element 13. The sensor element 13 may include the substrate 10.

The voltmeter 22 measures the voltage between both ends of the magnetic film 12. As long as being a voltmeter, the configuration is not particularly limited. It is allowable that an amplifier circuit is merely connected. Here, in the magnetoresistance effect, the magnitude of the measurement-target magnetic field to be applied in the lateral direction is measured as the change in the electric resistance value, and therefore, it is preferable to have means for keeping the voltage value between both ends of the magnetic film 12 when the measurement-target magnetic field is not present. For example, it is preferable to further add a control unit using an MPU (Micro Processor Unit), together with a display unit to display the measurement result.

Further, the voltage between both ends of the magnetic film 12 to be measured may be the voltage between both ends when multiple magnetic films 12 are connected in series or in parallel. Further, both ends may be both ends having a resistance therebetween. Furthermore, in the case where the magnetic film 12 is incorporated in a part of a bridge circuit, both ends may be balance points (see reference numerals 53, 54 in FIG. 12) of the bridge circuit. This is because it can be said that the balance points of the bridge circuit are both ends having a resistance or the magnetic film 12 therebetween.

When the sensor element 13, which is a sensitive part, is put into the measurement-target magnetic field, the magnetic sensor 2 with the temperature compensating function that has the above configuration can directly detect the magnitude of the measurement-target magnetic field, because the electric resistance value Rmr of the magnetic film 12 changes depending on the intensity of the lateral component of the measurement-target magnetic field in the magnetic film 12. As for the measurement-target magnetic field, not only the magnetic field from a permanent magnet but also the magnetic field to be generated by a flowing electric current can be detected, and therefore, the magnetic sensor 2 with the temperature compensating function can be suitably utilized also in an electric power measuring device.

Further, when the surrounding temperature changes, the magnetoresistance effect of the magnetic film 12 changes so as to become broader, as shown in FIG. 2(a). However, similarly, in the longitudinal bias magnetic field addition magnet 20, the magnetic field to be generated decreases due to the change in the temperature. Thereby, as shown in FIG. 3, the magnetoresistance effect returns to a steep mountain shape, and as a result, it is possible to maintain the sensitivity of the magnetic sensor in nearly the same state, even when the temperature changes.

Embodiment 2

Figure 5:
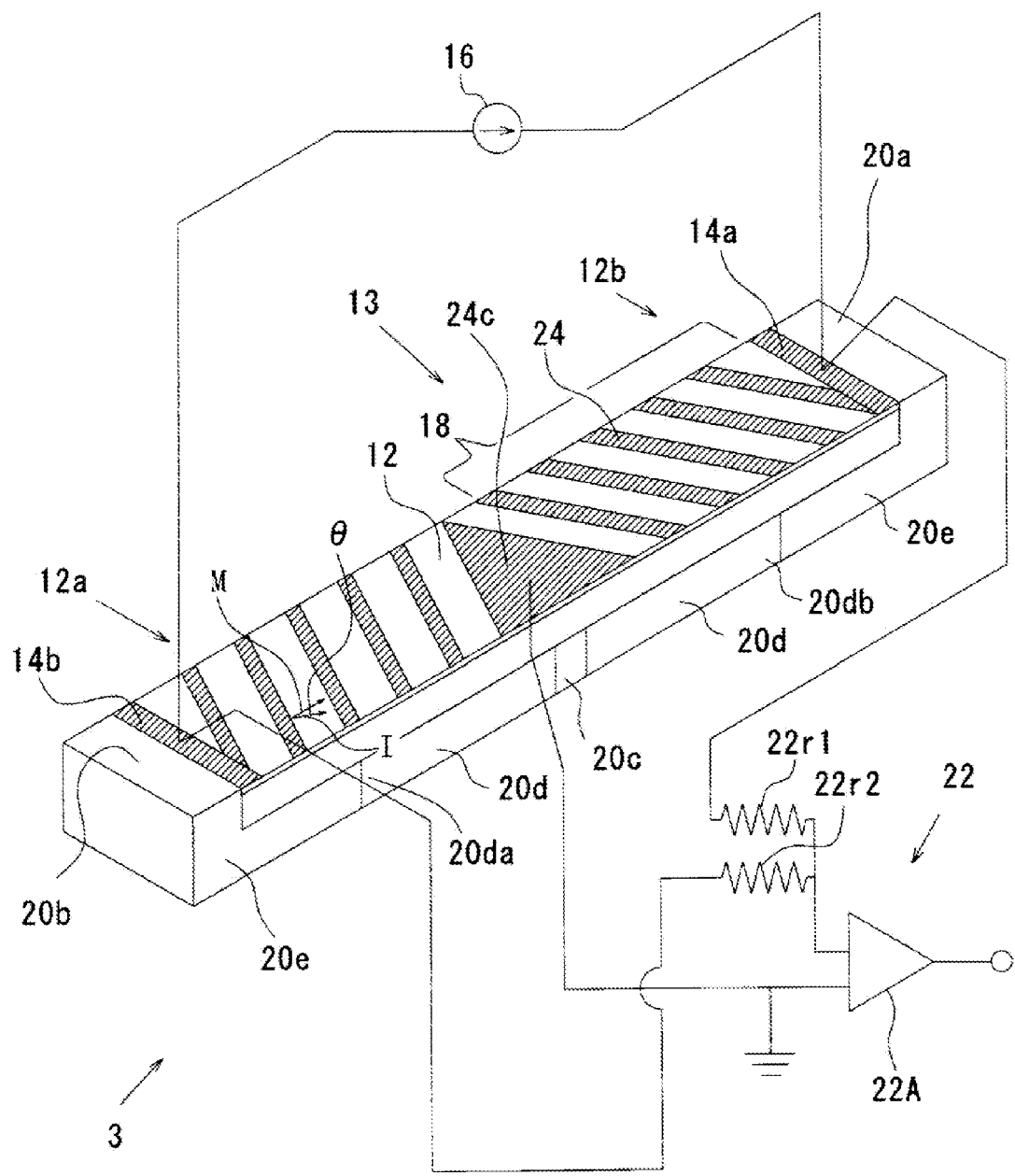
FIG. 5 is a diagram showing another embodiment of the sensor element according to the present invention.

FIG. 5 shows the configuration of a magnetic sensor 3 with the temperature compensating function according to the present embodiment. For the same parts as the magnetic sensor 2 with the temperature compensating function shown in Embodiment 1, the same reference characters are assigned, and the descriptions are omitted. In the magnetic sensor 3 with the temperature compensating function, the lateral bias magnetic field addition magnet 18 is configured by a pattern of an electric conductor 24 on the magnetic film 12.

On the magnetic film 12, a stripe pattern of the electric conductor 24 is formed between the electrodes 14a, 14b. For the electric conductor 24, similarly to the electrodes 14a, 14b, a material having a higher electric conductivity than that of the magnetic film 12 is used. The electric current flowing between the electrodes 14a, 14b flows through the intervals of the stripe-shaped electric conductor 24, across the shortest distance, and therefore, the angle of the electric current I flowing in the magnetic film 12 deviates from the axis between the electrodes 14a, 14b (in the longitudinal direction), by the angle θ of the stripe.

In other words, by the longitudinal bias magnetic field Hob, a magnetization M is oriented in the longitudinal direction, and therefore, the electric current I and the magnetization M are different in orientation. As a result, an effect equivalent to the addition of the lateral bias magnetic field Htb is produced. As already described, the structure in which the orientations of the magnetization M of the magnetic film 12 and the flowing electric current I are altered by the pattern of the electric conductor 24 provided on the magnetic film 12 in this way is also referred to as the lateral bias magnetic field addition magnet 18.

Further, the stripe-shaped electric conductor 24 is formed on the magnetic film 12, as patterns that are different in the direction of the inclination. At the conjunction part of these patterns, a common electrode 24c is formed. This is equivalent to a state in which sensor elements including the lateral bias magnetic field addition magnets 18 different in direction are connected in series. When the common electrode 24c is grounded and the electrodes 14a, 14b at both ends of the set of the sensor elements are adopted as the outputs, it is possible to synthesize the outputs of the two sensor elements, resulting in the doubling of the sensitivity.

Further, because of being grounded, the drift of the output is suppressed. Such a sensor element in which virtually multiple sensor elements are integrally made as a single pattern may also be referred to as the sensor element 13.

Here, there is shown an example in which the voltmeter 22, for corresponding to such a sensor element 13, is configured by an amplifier 22A including two inputs: an input through resistances 22r1, 22r2 for synthesizing both end electrodes 14a, 14b and an input grounded with the common electrode 24c.

Further, in the longitudinal bias magnetic field addition magnet 20, temperature-sensitive magnetic substances 20d, 20e are linked with a thin permanent magnet 20c. Here, the thin permanent magnet 20c is a magnet in which magnetic poles are formed in the plane direction and in which the interval between the magnetic poles is shorter than at least any one of the longitudinal length and lateral length configuring the magnetic pole surface. As the temperature-sensitive magnetic substances 20d, 20e, multiple kinds of temperature-sensitive magnetic substances having high magnetic permeability and different temperature characteristics are used, and are set such that the temperature characteristic increases from the close side to the distant side relative to the thin permanent magnet 20c.

In FIG. 5, two kinds of temperature-sensitive magnetic substances 20d, 20e are used. The temperature characteristic of the close temperature-sensitive magnetic substance 20d relative to the thin permanent magnet 20c is lower than the temperature characteristic of the distant temperature-sensitive magnetic substance 20e. Further, the temperature characteristic of the thin permanent magnet 20c may be low in a temperature range in which the magnetic sensor 3 with the temperature compensating function is used.

Figure 6:
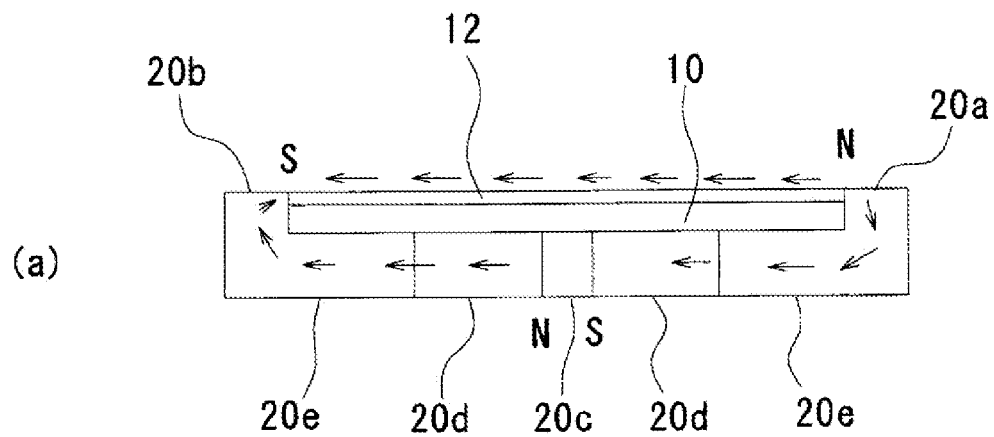
FIG. 6 are diagrams showing magnetic fields when the temperature compensation is performed.
Figure 6:
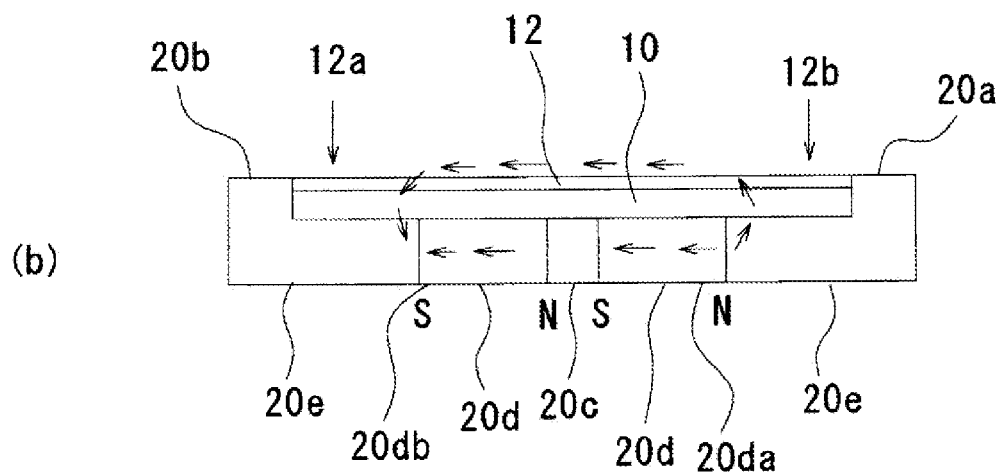
Figure 6:
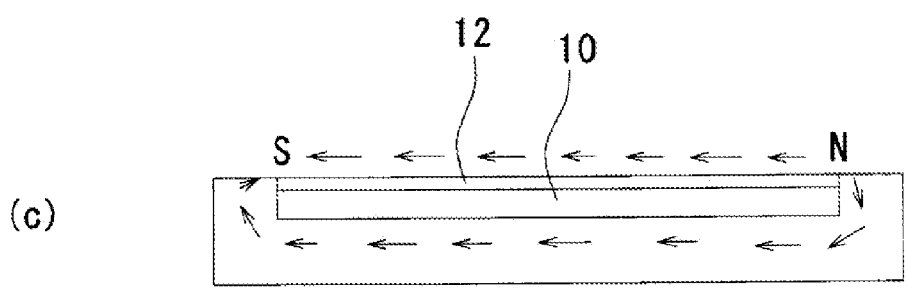

The operation of the magnetic sensor 3 with the temperature compensating function that has the above configuration will be described with reference to FIG. 6. With reference to FIG. 6(a), in the thin permanent magnet 20c, the leakage magnetic field is small due to the influence of the diamagnetic field. When the thin permanent magnet 20c is sandwiched between the temperature-sensitive magnetic substances 20d, 20e having a high magnetic permeability, magnetic poles N, S appear at the sides (20a, 20b) of the temperature-sensitive magnetic substances 20e.

With reference to FIG. 6(b), here, when the surrounding temperature rises, the magnetoresistance effect of the magnetic film 12 becomes broader. Meanwhile, in the temperature-sensitive magnetic substances 20d, 20e having high temperature characteristics, the magnetic permeability is lost from the distant temperature-sensitive magnetic substance 20e relative to the thin permanent magnet 20c. Then, the magnetic poles N, S appear between end parts 20da, 20db of the next temperature-sensitive magnetic substances 20d. When viewed from the magnetic film 12, the magnetic field at this time is equivalent to a magnetic field after the longitudinal bias magnetic field Hob having appeared between the magnetic poles 20a, 20b decreases.

Further, it can be seen that the application of the longitudinal bias magnetic field Hob is stopped for magnetic films 12a, 12b near the magnetic poles 20a, 20b, which stop generating the magnetic field. As a result, the magnetoresistance effect of the magnetic film 12, for which the restriction by the longitudinal bias magnetic field Hob of the magnetization M decreases, is shifted to a steep mountain shape, so that the sensitivity of the magnetic sensor does not change (see FIG. 4).

Here, with reference to FIG. 6(c), the generation of the longitudinal bias magnetic field Hob may be performed by a magnet of a temperature-sensitive magnetic substance, which has been described also in Embodiment 1. In this case, the magnetic poles do not move, but the magnetic field itself to be generated by the magnet decreases.

Embodiment 3

In Embodiments 1 and 2, the configurations in which the temperature characteristic of the longitudinal bias magnetic field addition magnet 20 is made higher than the temperature characteristic of the lateral bias magnetic field addition magnet 18 and thereby the temperature characteristic of the sensor element 13 is kept constant as a whole have been described. This is a technical idea in which the temperature characteristic of the magnetic film 12 and the temperature characteristic of the longitudinal bias magnetic field addition magnet 20 cancel each other out. The sensor element 13 according to the present invention is not limited to this, and may be configured such that the temperature characteristic of the magnetic film 12 and the temperature characteristics of the longitudinal bias magnetic field addition magnet 20 and lateral bias magnetic field addition magnet 18 cancel each other out.

Figure 7:
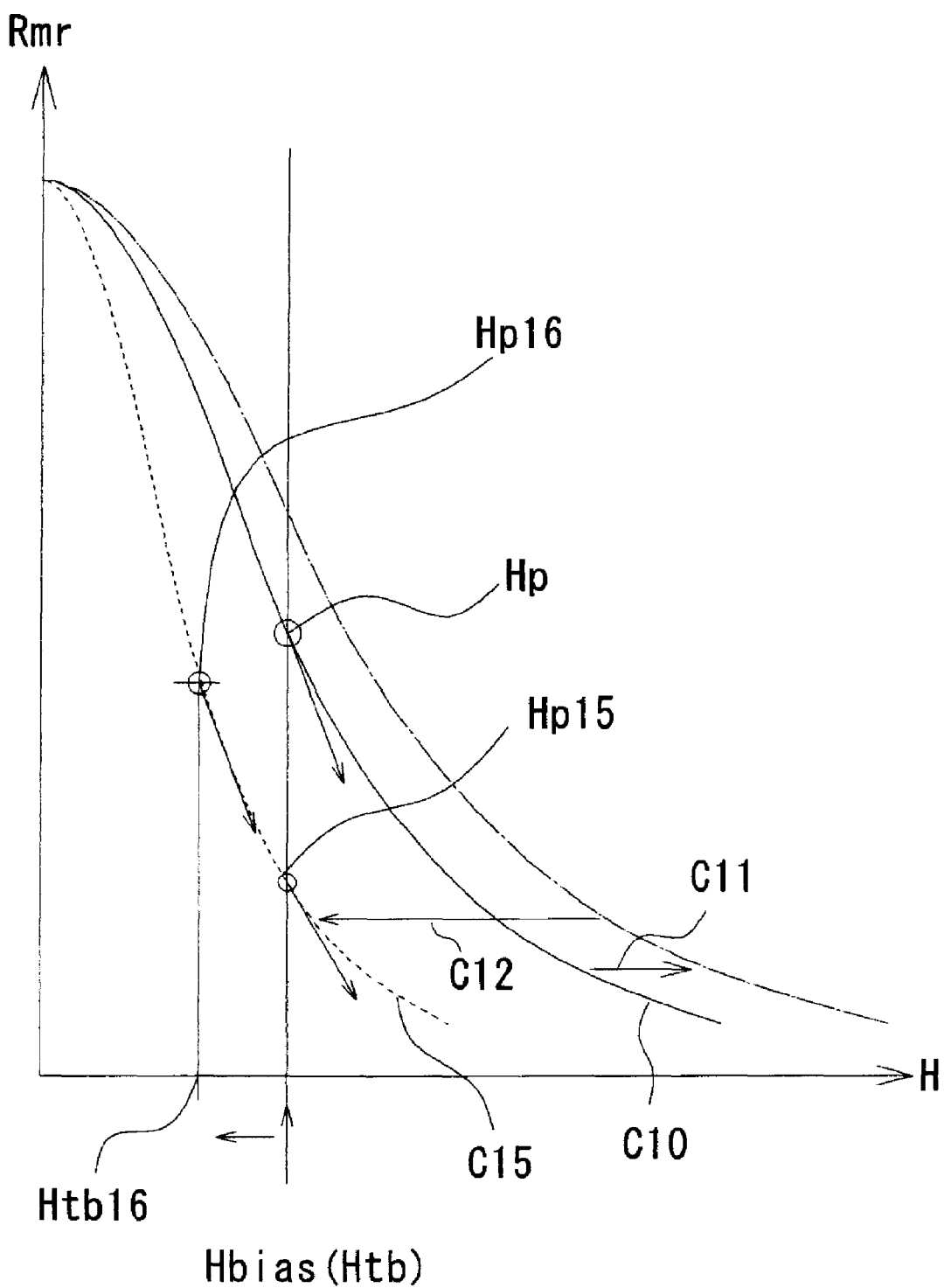
FIG. 7 is a diagram showing the magnetoresistance effect for describing another temperature compensation method.

FIG. 7 shows the principle. FIG. 7 shows a graph of the magnetoresistance effect. The abscissa indicates the magnetic field H applied in the lateral direction of the magnetic film 12, and the ordinate indicates the resistance value Rmr of the magnetic film 12. As already described, when the temperature rises, the magnetoresistance effect shown by a curve C10 at the beginning changes so as to become broader, due to the temperature characteristic of the magnetic film 12 (C11). On the other hand, when the longitudinal bias magnetic field Hob decreases due to the temperature rise, the magnetoresistance effect changes so as to become steeper. In Embodiments 1 and 2, these effects cancel each other out.

However, as shown in an example described later, when the longitudinal bias magnetic field Hob decreases, the magnetoresistance effect changes exponentially so as to become steeper (C12). That is, in some cases, the degree (C12) to which the magnetoresistance effect becomes steeper due to the decrease in the longitudinal bias magnetic field Hob is greater than the degree (C11) to which the magnetoresistance effect of the magnetic film 12 becomes broader due to the temperature rise.

In such a case, the operating point Hp is at a foot part Hp15 of a curve C15 showing the magnetoresistance effect, and the sensitivity of the sensor element 13 decreases remarkably. Hence, the lateral bias magnetic field Htb is also decreased simultaneously (Htb16), and the operating point Hp is moved to a part Hp16 having a higher sensitivity. Here, in FIG. 7, the sensitivity is shown as a tangent line of the curve showing the magnetoresistance effect. That is, the slope (shown as an arrow) at the operating point Hp is inclined more steeply than the slope at the operating point Hp15, and the slope at the operating point Hp16 is nearly the same as the slope at the operating point Hp.

Figure 8:
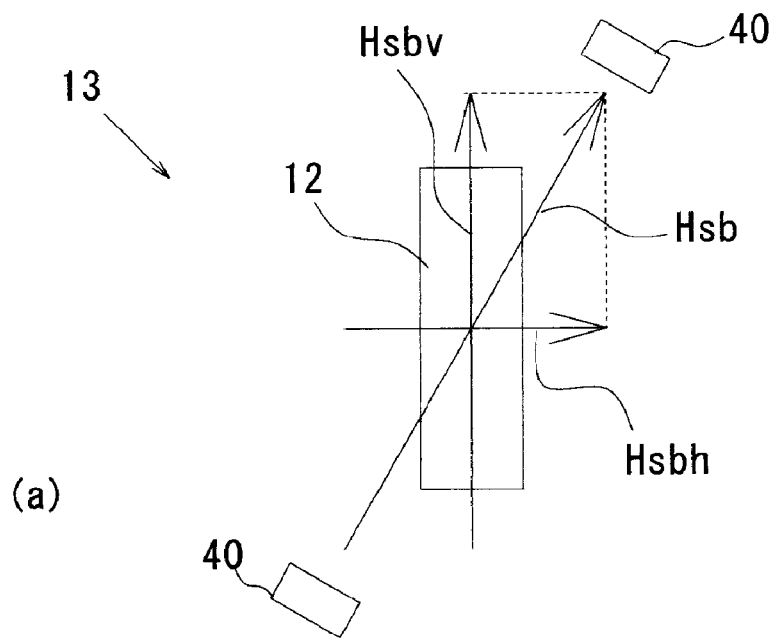
FIG. 8 are diagrams showing the configurations of sensor elements using a oblique bias magnetic field.
Figure 8:
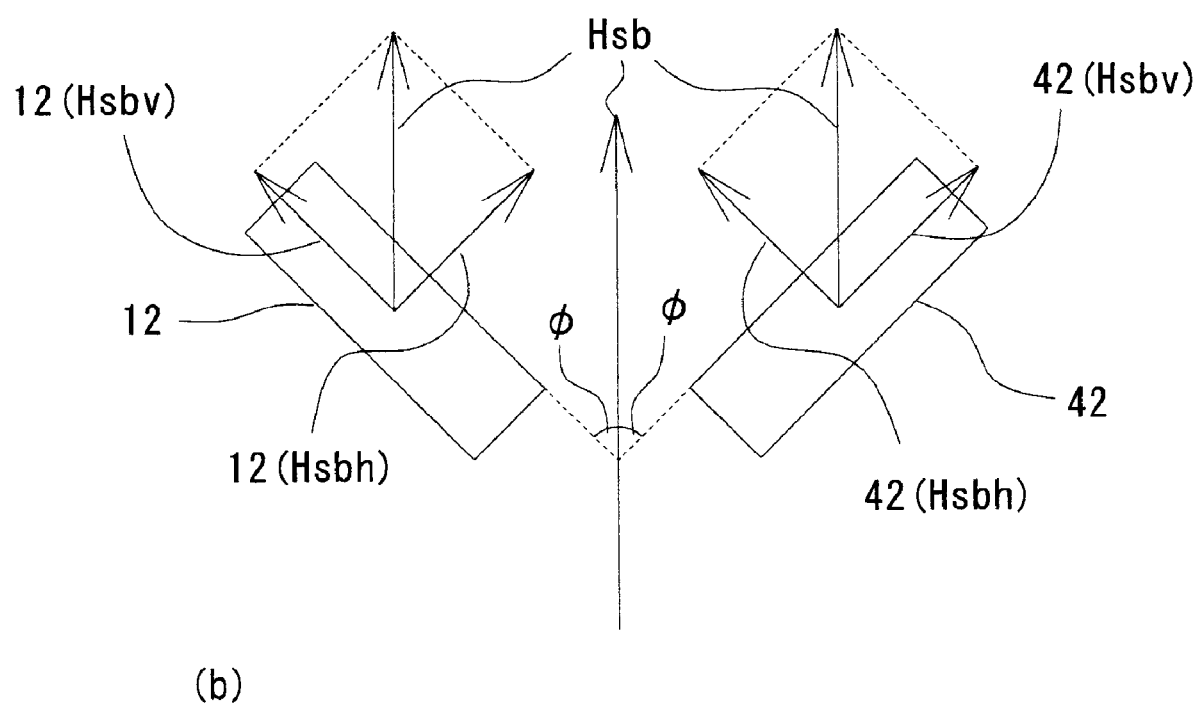

FIG. 8 show specific methods. With reference to FIG. 8(a), a bias magnetic field (oblique bias magnetic field Hsb) in a oblique direction is applied to the magnetic film 12. A magnet to apply the oblique bias magnetic field Hsb to the magnetic film 12 is referred to as a oblique bias magnetic field addition magnet 40. The oblique bias magnetic field addition magnet 40 may be a combination of multiple magnets having the same degree of temperature characteristic, or may be an electromagnet.

That is, the longitudinal bias magnetic field addition magnet 20 to decrease the magnetic characteristic with the temperature rise, and the lateral bias magnetic field addition magnet 18 to decrease the lateral bias magnetic field such that the change in the magnetic characteristic of the longitudinal bias magnetic field addition magnet 20 does not change the sensitivity at the operating point Hp very much may be combined and used. Further, an electromagnet that is controlled so as to change the output magnetic field depending on the temperature may be used. Further, the oblique bias magnetic field addition magnet 40 may be configured by combining the permanent magnet and the electromagnet.

Figure 2:
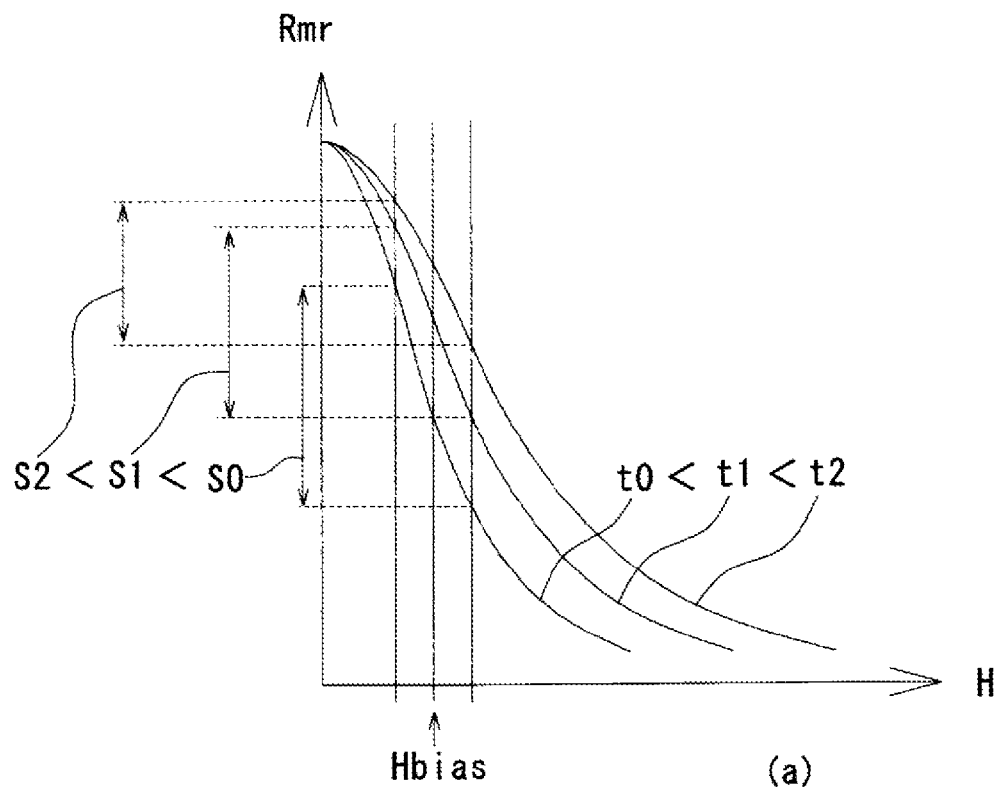
FIG. 2 are graphs showing the influences of temperatures and longitudinal bias magnetic fields on the magnetoresistance effect.
Figure 2:
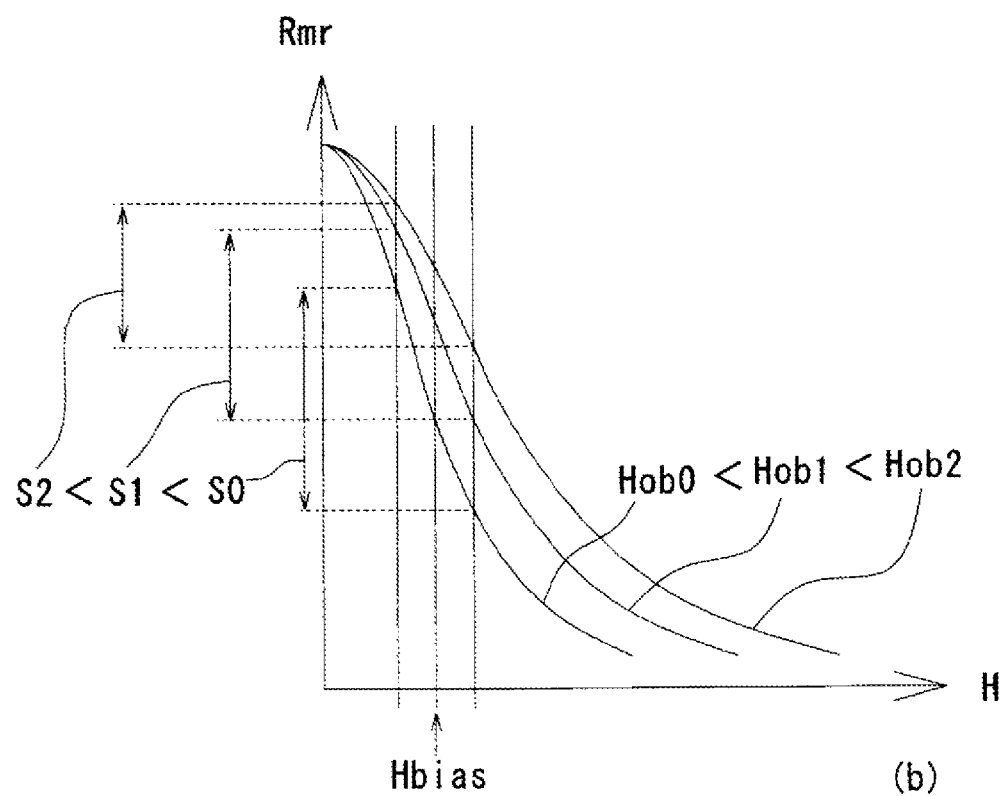

For example, a configuration in which the magnetic field to be generated by a pair of magnetic poles is applied in the oblique direction to the longitudinal direction of the magnetic film 12, is simple and suitable. For example, the C-shaped magnet (longitudinal bias magnetic field addition magnet 20) shown in FIG. 2 is arranged obliquely with respect to the magnetic film 12.

The magnetic field is a vector, and therefore, for the oblique bias magnetic field Hsb, it is possible to consider a longitudinal bias magnetic field component and a lateral bias magnetic field component separately. Here, the longitudinal bias magnetic field component is referred to as an equivalent longitudinal bias magnetic field Hsbv, and the lateral bias magnetic field component is referred to as an equivalent lateral bias magnetic field Hsbh.

The equivalent lateral bias magnetic field Hsbh is a magnetic field that can be regarded as being applied in the lateral direction (the direction orthogonal to the longitudinal direction) of the magnetic film 12. That is, the equivalent lateral bias magnetic field Hsbh has the effect of moving the operating point Hp of the magnetoresistance effect. This configuration may be said to exhibit the same effect as the barber pole structure shown in FIG. 5. Because of the equivalent longitudinal bias magnetic field Hsbv and the equivalent lateral bias magnetic field Hsbh, the oblique bias magnetic field addition magnet 40 is thought to be equivalent to having the longitudinal bias magnetic field addition magnet 20 and the lateral bias magnetic field addition magnet 18. Therefore, also the configuration in FIG. 8 may be called the sensor element 13.

FIG. 8(b) shows a first magnetic film 12 and a second magnetic film 42 that are magnetic films having the longitudinal directions inclined with respect to the oblique bias magnetic field Hsb and that are arranged at positions mutually symmetrical with respect to the direction of the oblique bias magnetic field Hsb as the line-symmetry axis. In each of the magnetic films 12, 42, the equivalent longitudinal bias magnetic field Hsbv and the equivalent lateral bias magnetic field Hsbh are considered. The angles of the first magnetic film 12 and the second magnetic film 42 relative to the application direction of the oblique bias magnetic field Hsb, both, are φ.

The equivalent longitudinal bias magnetic field Hsbv of the magnetic film 12 is denoted by reference character 12(Hsbv), and the equivalent lateral bias magnetic field Hsbh of the magnetic film 12 is denoted by reference character 12(Hsbh). Further, the equivalent longitudinal bias magnetic field Hsbv and equivalent lateral bias magnetic field Hsbh of the magnetic film 42 are denoted by reference characters 42(Hsbv), 42(Hsbh), respectively.

It is found that the equivalent longitudinal bias magnetic fields Hsbv and equivalent lateral bias magnetic fields Hsbh of the first magnetic film 12 and second magnetic film 42 have a line-symmetrical relation with respect to the direction of the oblique bias magnetic field Hsb as the symmetry axis. That is, the lateral bias magnetic fields Htb of the first magnetic film 12 and second magnetic film 42 are applied such that the directions are the reverse orientations to each other, with respect to the longitudinal bias magnetic fields Hob of the first magnetic film 12 and second magnetic film 42.

In FIG. 8, the lateral bias magnetic field of the first magnetic film 12 is the equivalent lateral bias magnetic field 12(Hsbh), and the lateral bias magnetic field of the second magnetic film 42 is the equivalent lateral bias magnetic field 42(Hsbh). These are on the right side and left side, relative to the respective longitudinal bias magnetic fields (12(Hsbv) and 42(Hsbv)), respectively.

Figure 9:
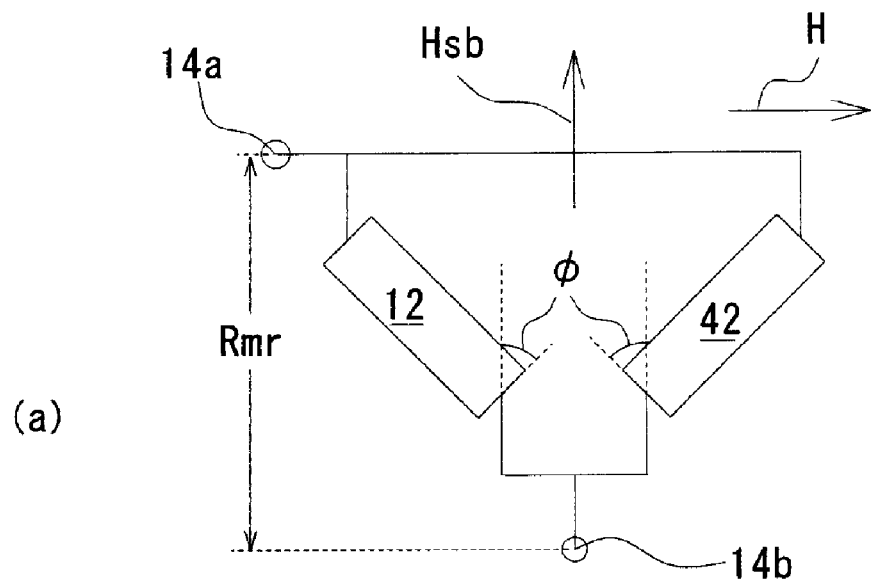
FIG. 9 are diagrams showing a configuration in the case of using a pair of magnetic films with use of the oblique bias magnetic field.
Figure 9:
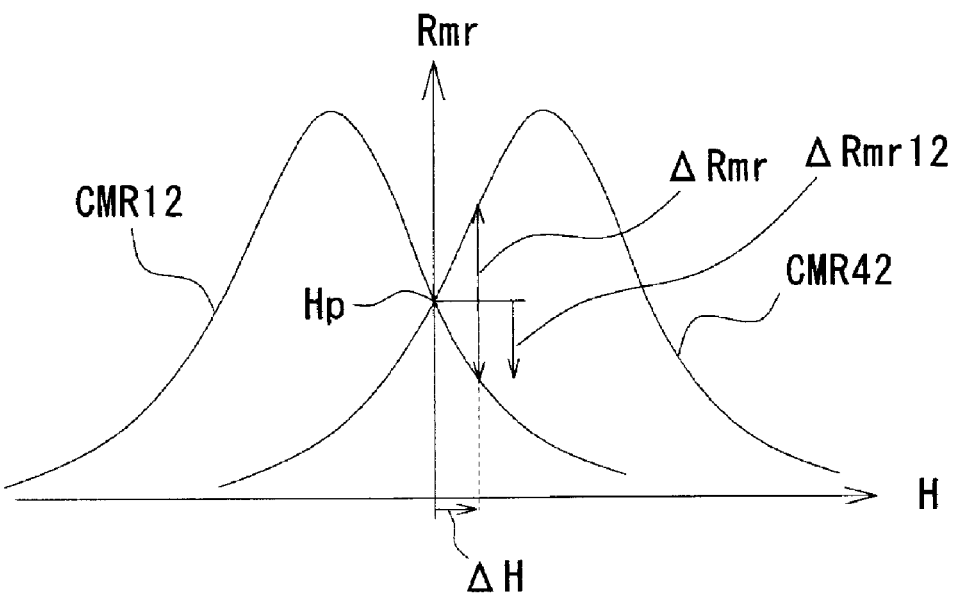

FIG. 9(a) shows a configuration in which the first magnetic film 12 and second magnetic film 42 in FIG. 8(b) are connected in parallel. FIG. 9(b) shows the magnetoresistance effect of the first magnetic film 12 and second magnetic film 42 on this occasion. In FIG. 9(b), the abscissa indicates the magnetic field H applied from the direction orthogonal to the direction of the oblique bias magnetic field Hsb, and the ordinate indicates the resistance value Rmr between the electrodes 14a, 14b.

A magnetoresistance effect CMR12 of the first magnetic film 12 is biased in the minus direction, by the equivalent lateral bias magnetic field 12(Hsbh). Further, a magnetoresistance effect CMR42 of the second magnetic film 42 is biased in the plus direction, by the equivalent lateral bias magnetic field 42(Hsbh).

The resistance value Rmr between the electrodes 14a, 14b is observed as the difference between them. That is, when an external magnetic field ΔH is applied from the exterior in the direction orthogonal to the direction of the oblique bias magnetic field Hsb, the change ΔRmr in the resistance value is obtained as the amount of the difference between the curves of the respective magnetoresistance effects. If only the magnetic film 12 is present, the resistance change due to ΔH is only a change ΔRmr12 from the operating point Hp to the point of the magnetoresistance effect CMR12. Therefore, the gain of the output increases.

As advantages of such a configuration, in addition to the effect of the increase in the gain of the output, it is possible to take a high impedance, because the electric current flowing in the oblique direction to the longitudinal direction of the magnetic film 12 is not partial unlike the barber pole structure. In the case of being capable of taking a high impedance, it is possible to obtain a high output voltage. By regulating the inclined angle φ (see FIG. 9(a), FIG. 8(b)) of the magnetic film 12 relative to the direction of the oblique bias magnetic field Hsb, it is possible to regulate the sensitivity of the sensor element 13 itself.

Further, it is unnecessary to form the electric conductor 24, resulting in the effect of the simplification of the production. Further, if the oblique bias magnetic field addition magnet 40 has a temperature characteristic, it is possible to compensate the temperature characteristic of the sensor element 13 itself.

Figure 10:
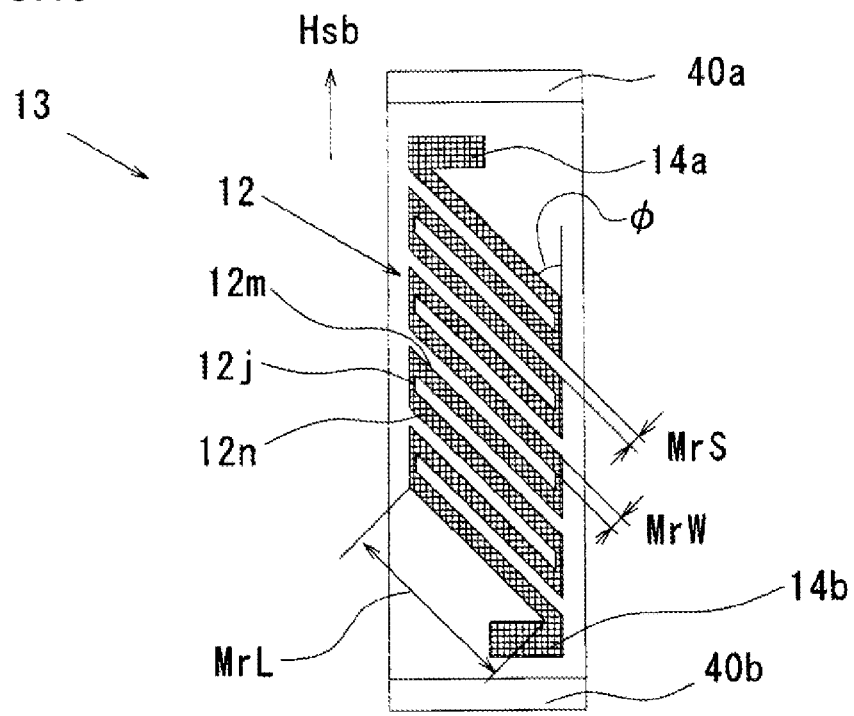
FIG. 10 are diagrams showing the configurations of sensor elements each of which adopts a C-shaped magnet as a oblique bias magnetic field addition magnet.
Figure 10:
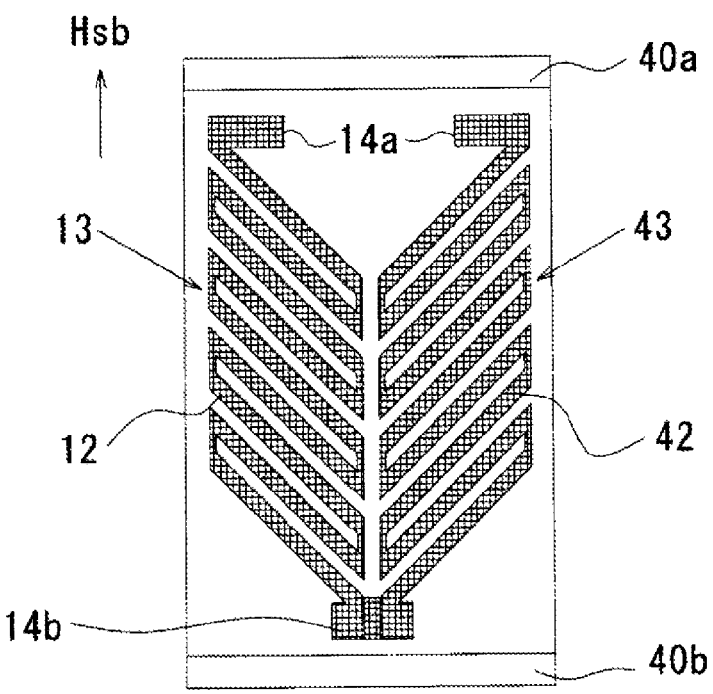

FIG. 10 show the configurations of sensor elements 13 each of which adopts a C-shaped magnet as the oblique bias magnetic field addition magnet 40. Reference characters 4a, 40b denote magnetic poles of the oblique bias magnetic field addition magnet 40. Here, examples in each of which multiple magnetic films 12 are arranged are shown. Thus, the presence of multiple magnetic films is not excluded. At a connecting spot 12j between adjacent magnetic films (for example, a magnetic film 12m and a magnetic film 12n), an electric conductor may be connected, or short magnetic films themselves may be connected in series.

The magnetic film at the connecting spot 12j is shortened, and thereby, there is little influence on the whole of the sensor element 13. Basically, the electrodes 14a, 14b are provided similarly to FIG. 1 and FIG. 4. Here, in FIG. 10(a), the length of the magnetic film 12 is MrL, the width is MrW, the gap between the magnetic films 12 is MeS, and the angle between the magnetic film and the oblique bias magnetic field Hsb is φ.

All the magnetic films 12 are inclined at the same angle, relative to the direction of the oblique bias magnetic field Hsb. Therefore, the oblique bias magnetic field addition magnet 40 inclines the magnetizations of all the magnetic films 12 of the sensor element 13, in the same direction. That is, all the magnetic films 12 in FIG. 10(a) are equivalent to having the lateral bias magnetic field applied in the same direction.

FIG. 10(b) shows an example of the configuration of including the first magnetic film 12 and the second magnetic film 42 arranged at positions that are symmetrical with respect to the direction of the oblique bias magnetic field Hsb. It may be said that the first magnetic film 12 and the second magnetic film 42 share the electrodes 14a, 14b such that the respective magnetic films are connected in parallel.

Preferably, such a sensor element 13 should be arranged such that the orientation of the oblique bias magnetic field Hsb is in the same direction as the electric current that is the measurement target. This is because the external magnetic field is applied from the measurement target to the sensor element 13 in the orthogonal direction to the oblique bias magnetic field Hsb. Here, in the case of regarding the magnetic film 12 and the magnetic film 42 as different sensor elements from each other, it may be said that a sensor element 13 and a sensor element 43 are formed in FIG. 10(b). Further, both of the sensor elements in 10(a), (b) become magnetic sensors, by the addition of the current source 16 and voltmeter 22, as shown in FIG. 4.

Embodiment 4

The magnetic sensors shown in Embodiments 1 and 2 can be applied as electric power measuring devices. First, the measurement principle in an electric power measuring device will be described with reference to FIG. 11. The circuit configuration is a parallel circuit in which the electric current from a power source 91 ($V_{in}$) is divided into electric currents $I_1$ and $I_2$. The electric current from the power source 91 ($V_{in}$) flows, in parallel, along a conveyance path for making the electric current $I_1$ flow through a load 92 ($R_1$) for which the consumed electric power is measured, and a measurement path for making the electric current $I_2$ flow through the sensor element 13 and a sensor resistance 34 ($R_2$). Here, the sensor resistance 34 ($R_2$) is sufficiently higher than the resistance value Rmr of the magnetic film 12. The sensor resistance 34 is a resistance for making a constant electric current flow through the magnetic film 12 of the sensor element 13.

The electric current $I_1$ flowing through the load 92 generates the magnetic field H around the conductive wire. Due to the magnetic field H, the magnetic film 12 exhibits the magnetoresistance effect, and the voltage Vmr between both ends of the magnetic films 12 changes. The output voltage Vmr is proportional to the consumed electric power in the load 92. Therefore, by the measurement of output voltage Vmr, it is possible to measure the consumed electric power in the load 92.

The voltage Vmr between both ends of the magnetic film 12 expresses the consumed electric power in the load 92. This can be described as follows. First, the magnetic field H to be generated by the electric current $I_1$ flowing through the load 92 is expressed by Formula (1), when the proportionality constant is α.

$$H = \alpha I_1 \quad (1)$$

The resistance value ΔRmr to be changed by the magnetoresistance effect is proportional to the magnetic field H, and therefore, is expressed by Formula (2), when the proportionality constant is β.

$$\Delta Rmr = \beta H = \beta(\alpha I_1) \quad (2)$$

The whole resistance value Rmr of the magnetic film 12 is expressed by Formula (3), when the resistance in a state in which the magnetic field H is not applied is Rmr0.

$$Rmr = Rmr0 + \Delta Rmr = Rmr0 + \alpha\beta I_1 \quad (3)$$

The voltage Vmr between both ends of the magnetic film 12 when the electric current $I_2$ flows through the magnetic film 12 is expressed by Formula (4).

$$Vmr = Rmr * I_2 = (Rmr0 + \Delta Rmr) * I_2 \quad (4)$$
$$= (Rmr0 + \alpha\beta I_1) * I_2$$

When the alternating-current output of the power source 91 is $V_{in}$, the amplitude is $V_1$, each frequency is ω and the time is t, the output of the power source 91 is expressed by Formula (5). Further, the electric current $I_1$ flowing through the load 92 and the electric current $I_2$ flowing through the sensor element are expressed by Formula (6) and Formula (7).

[Expression 1]

$$V_{in} = V_1 \sin\omega t \quad (5)$$

$$I_1 = \frac{V_1}{R_1} \sin(\omega t - \theta) \quad (6)$$

$$I_2 = \frac{V_1}{R_2} \sin\omega t \quad (7)$$

The voltage Vmr between both ends of the magnetic film 12 when the electric current $I_2$ flows through the magnetic film 12 is determined by Formula (8).

[Expression 2]

$$\begin{aligned}V_{mr} &= (R_{mr0} + \alpha\beta I_1)I_2 \quad (8)\\ &= \left(R_{mr0} + \alpha\beta\frac{V_1}{R_1}\sin(\omega t - \theta)\right)\frac{V_1}{R_2}\sin\omega t \\ &= \frac{R_{mr0}V_1}{R_2}\sin\omega t - \alpha\beta\frac{V_1}{R_1}\frac{V_1}{R_2}\frac{1}{2}\cos(2\omega t - \theta) + \\ &\quad \alpha\beta\frac{V_1}{R_1}\frac{V_1}{R_2}\frac{1}{2}\cos\theta \\ &= \text{AC compornent} + \text{DC compornent}\left(k * \frac{V_1^2}{R_1}\cos\theta\right)\end{aligned}$$

Formula (8) is the sum of an AC component and a DC component. That is, in the output voltage Vmr in the longitudinal direction of the magnetic film 12, the alternating-current voltage and the direct-current voltage appear so as to be superimposed. Therefore, by measuring only the direct-current voltage component in the longitudinal direction of the magnetic film 12, it is possible to measure the consumed electric power ($P = I_1 * V_1 = V_1^2/R_1$) in the load 92 for the power source 91. Here, the DC component in the above final formula is proportional to ($V_1^2/R_1$)cos θ. That is, the measurement of Vmr leads to the measurement of the effective electric power including the power factor cos θ.

Figure 11:
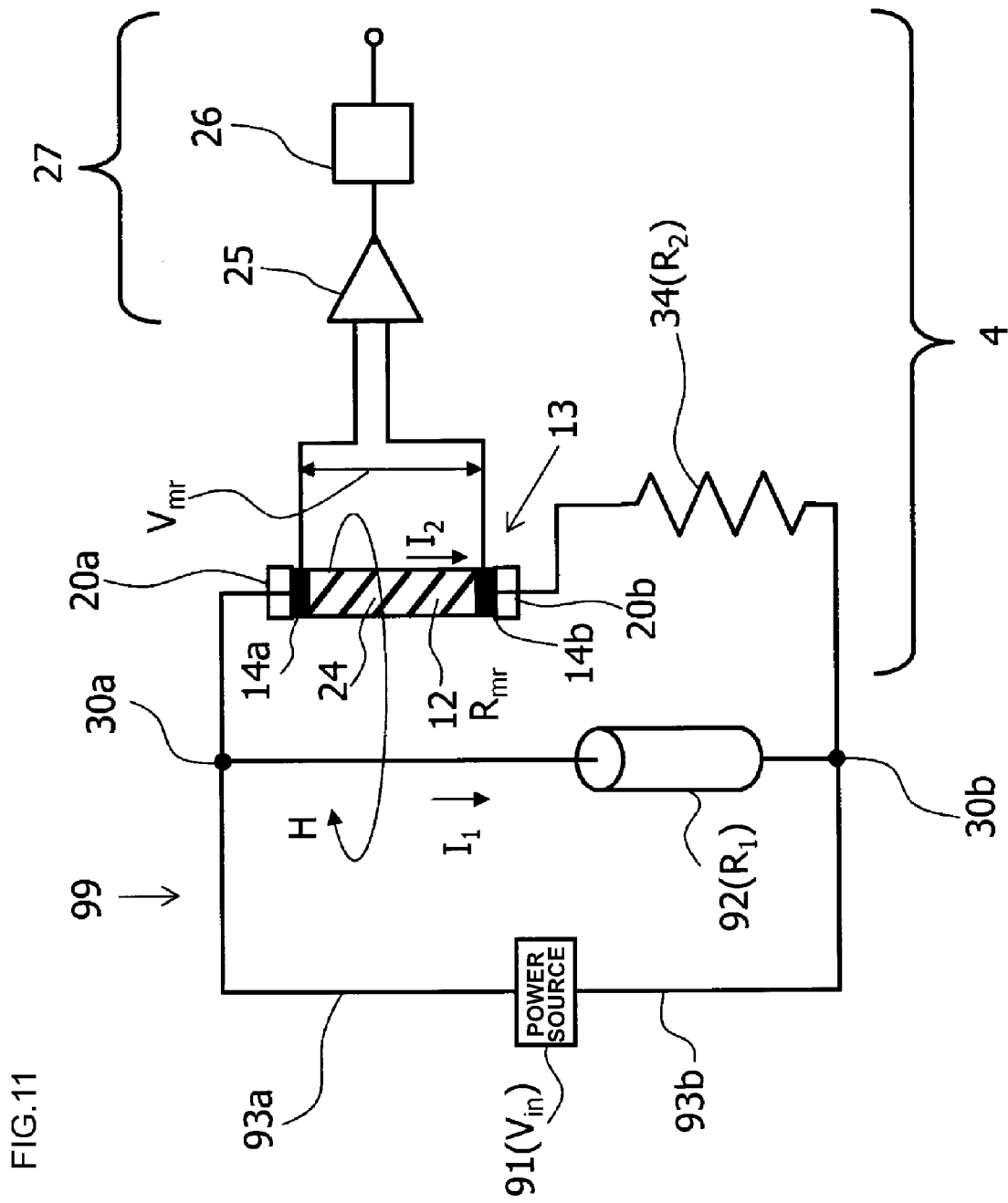
FIG. 11 is a diagram showing the configuration of an electric power measuring device using the sensor element according to the present invention.

Based on the measurement principle described above, the configuration of an electric power measuring device 4 will be described. With reference to FIG. 11, the electric power measuring device 4 includes the sensor element 13 including the magnetic film 12, the sensor resistance 34, and a voltmeter 27 to measure the voltage of the sensor element 13. The voltmeter 27 is constituted by an amplifier 25 and a filter 26. With the filter 26, it is possible to measure only the direct-current component of the output of the amplifier 25. Furthermore, the electric power measuring device 4 includes a pair of connecting terminals (30a, 30b) for connecting these configurations with the conveyance circuit in which the electric power is measured. Here, in the case where the measurement-target circuit is a direct-current circuit, only a direct-current voltage is generated between both ends of the magnetic film 12, and therefore, the filter 26 is unnecessary.

The sensor element 13 is the sensor element 13 described in Embodiment 1 or 2, and includes the lateral bias magnetic field addition magnet 18 (not illustrated) and the longitudinal bias magnetic field addition magnet 20. The lateral bias magnetic field addition magnet 18 of the sensor element 13 in FIG. 11 is actualized as a structure in which a single kind of stripe-shaped electric conductor 24 is formed. The longitudinal bias magnetic field addition magnet 20 is a permanent magnet, and has the temperature characteristic as shown in FIG. 4.

Since the sensor element 13 has the temperature compensating function, the electric power measuring device 4 can maintain a stable accuracy, even when the temperature at the use spot changes and the magnetoresistance effect of the magnetic film 12 changes.

Figure 12:
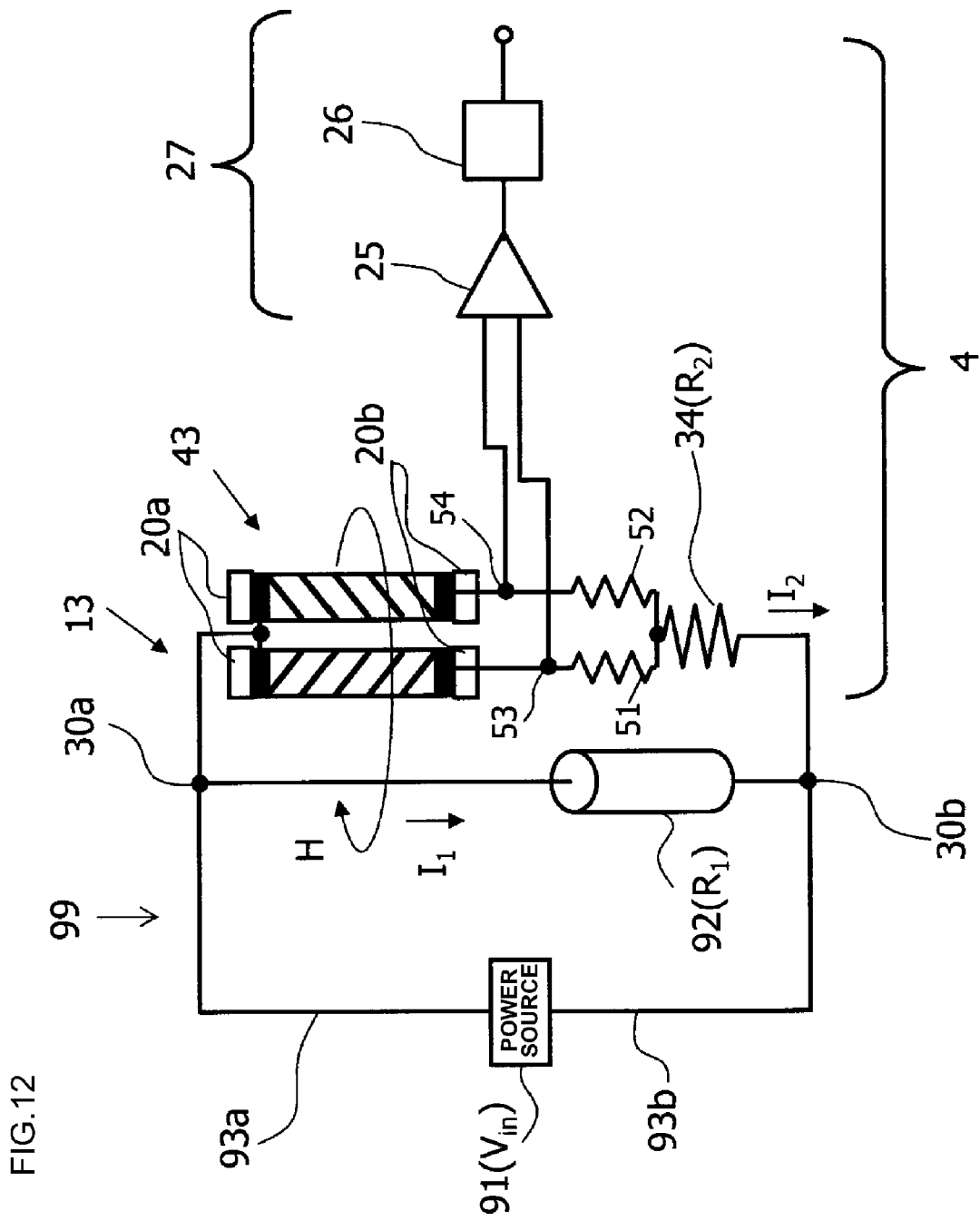
FIG. 12 is a diagram showing the configuration of an electric power measuring device using a pair of sensor elements incorporated in a bridge circuit.

FIG. 12 shows an example in which a bridge circuit having the two sensor elements 13, 43 incorporated is used. The voltmeter 27 is connected with connecting points 54, 55 (balance points) between the sensor elements 13, 43 and bridge resistances 51, 52. Thus, by incorporating the two sensor elements in the bridge circuit in parallel and taking the outputs from the balance points, it is possible to increase the sensitivity of the output.

As the sensor element 43, there is used a sensor element that has the same structure as the sensor element 13 and on which the electric conductor 27 is formed so as to be inclined in the reverse orientation to the direction (longitudinal direction) of the longitudinal bias magnetic field of the longitudinal bias magnetic field addition magnet 20. By such a configuration, as shown in FIG. 9(b), the magnetoresistance effects of the sensor element 13 and sensor element 43 are biased in the reverse directions, and the gain of the output increases.

Here, as the longitudinal bias magnetic field addition magnets 20 of the sensor elements 13, 43, longitudinal bias magnet field addition magnets having the same temperature characteristic are used. Further, even in the case of such a connection, it may be said that the voltmeter 27 measures the voltage between both ends of the sensor element 13. This is because the voltmeter 27 measures the voltage between both ends of the sensor element 13 through the sensor element 43.

Embodiment 5

Figure 13:
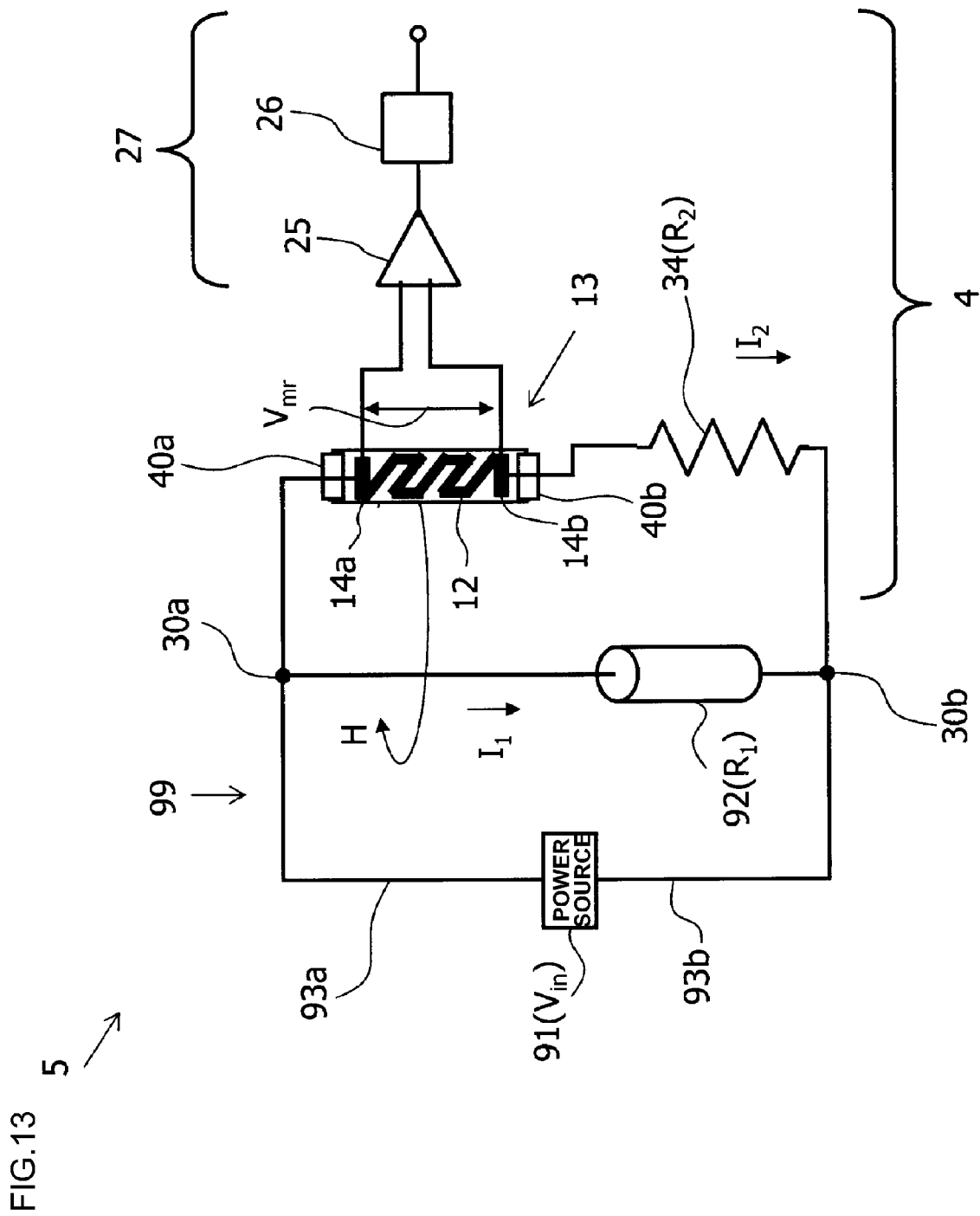
FIG. 13 is a diagram showing the configuration of an electric power measuring device using a sensor element with use of the oblique bias magnetic field.

The electric power measuring device 5 shown in Embodiment 4 can be equipped with the sensor element 13 including the oblique bias magnetic field addition magnet 40. FIG. 13 shows a configuration example of the electric power measuring device 5 having such a configuration. In the example, the sensor element including the oblique bias magnetic field addition magnet 40 shown in FIG. 10(a) is used instead of the sensor element including the barber pole structure in FIG. 11. Here, reference characters 40a, 40b denote the magnetic poles of the oblique bias magnetic field addition magnet 40.

Figure 14:
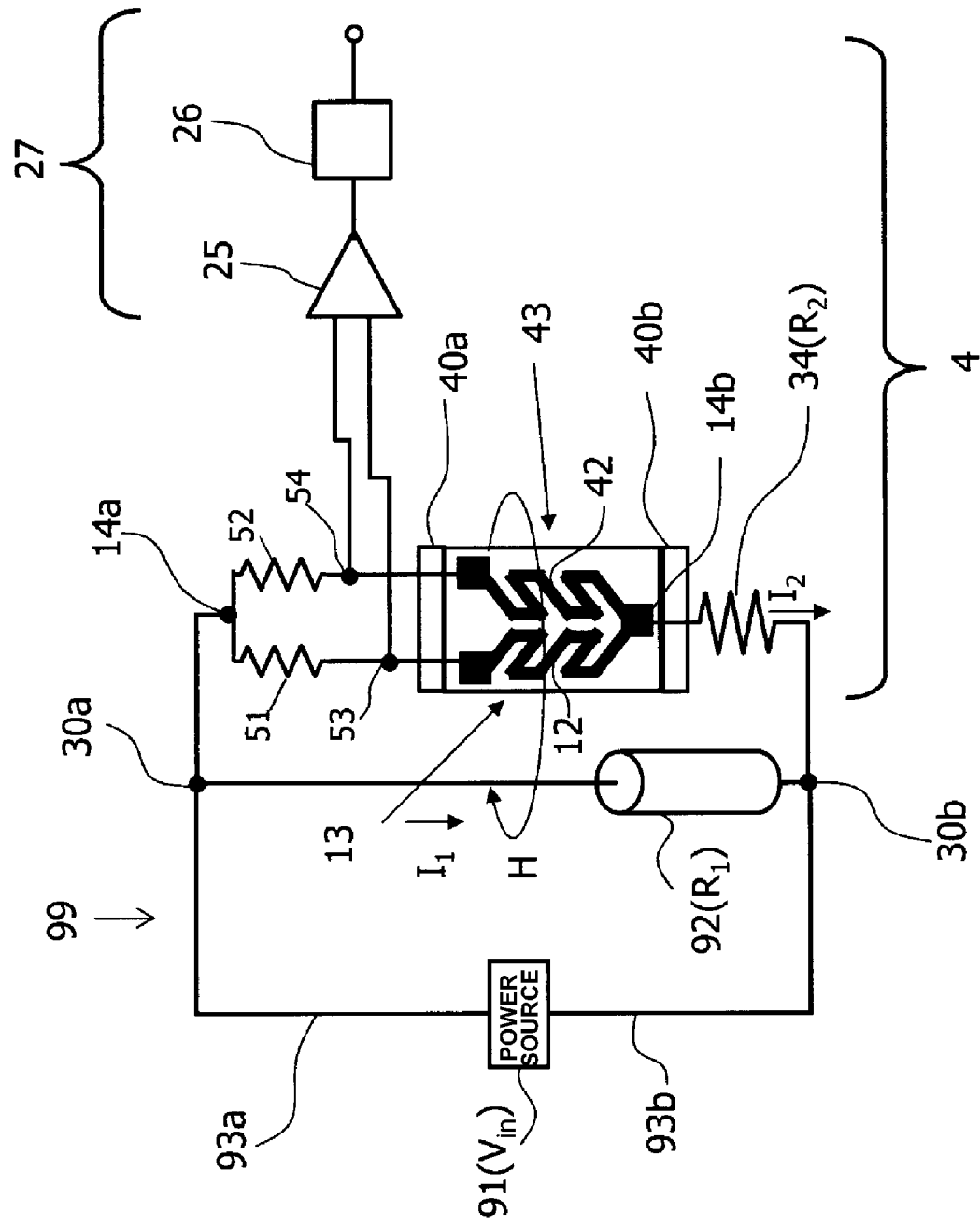
FIG. 14 is a diagram showing the configuration of an electric power measuring device using a pair of sensor elements with use of the oblique bias magnetic field.

Further, FIG. 14 exemplifies a case of using the sensor elements 13, 43 including the first magnetic film 12 and the second magnetic film 42. Here, the oblique bias magnetic field addition magnet 40 is shared by the sensors 13, 14. The sensor elements 13, 43 share the electrode 14a through the bridge resistances 51, 52 respectively, and share the electrode 14b directly. Further, the voltmeter 27 measures the voltage for the connecting points 53, 54 between the sensor elements 13, 43 and the bridge resistances 51, 52. As described in FIG. 12, also in this case, it may be said that the voltmeter 27 measures the voltage between both ends of the sensor element.

Since each of the sensor elements 13, 43 has the temperature characteristic compensating function, these electric power measuring devices 5 also can maintain a stable accuracy, even when the temperature at the use spot changes and the magnetoresistance effects of the first magnetic film 12 and second magnetic film 42 change.

EXAMPLE

Figure 15:
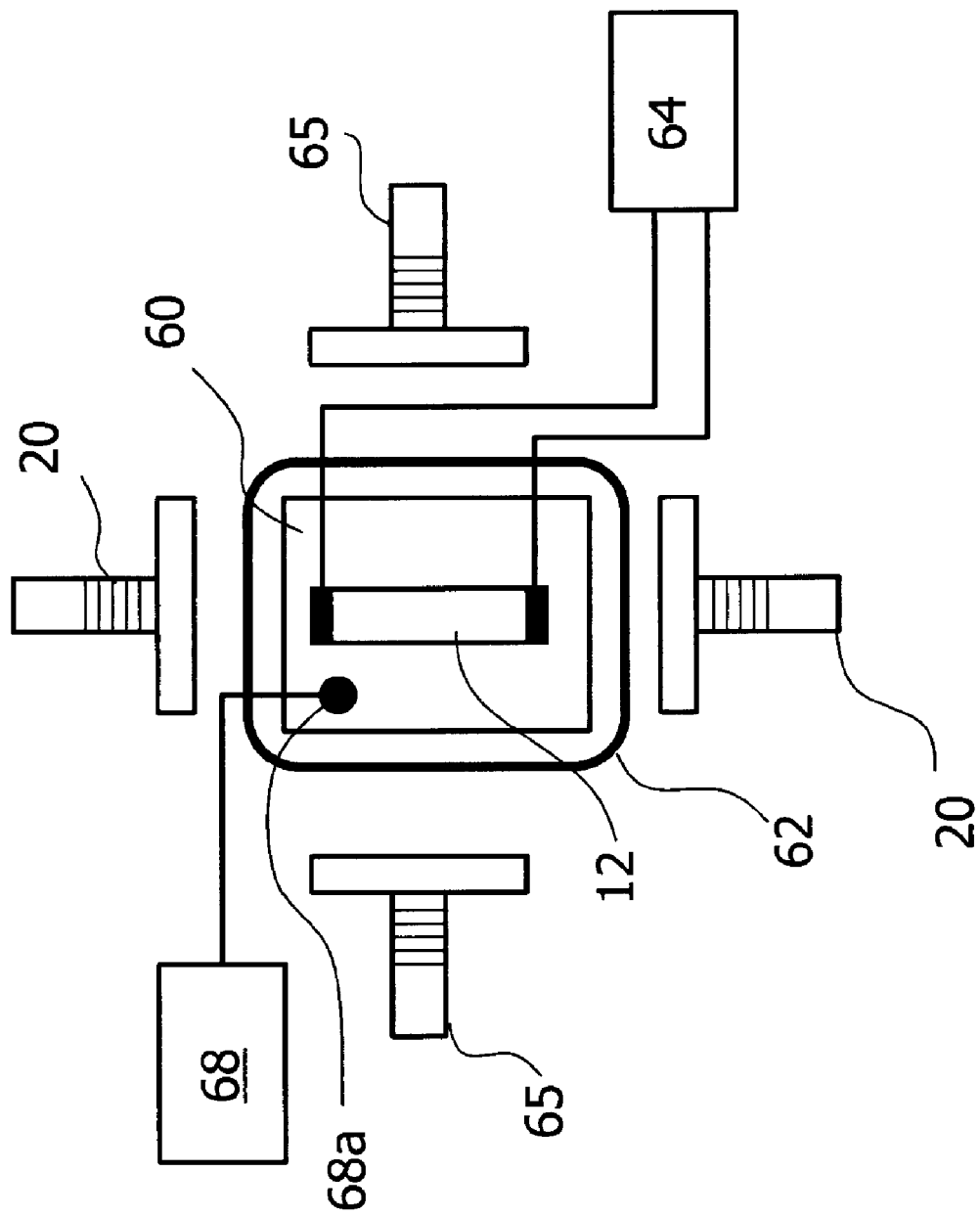
FIG. 15 is a diagram showing the configuration of an experimental apparatus in an example.

Hereinafter, an example of the temperature compensation of the magnetoresistance effect will be shown. FIG. 15 shows an experimental circuit. As the magnetic film 12, a sputtering film of 79-permalloy was formed on a glass substrate. The film thickness was 0.3 μm. This film was formed into a strip shape with a length of 10 mm and a width of 1 mm, by photolithography. At both ends, copper films with a thickness of 0.1 μm were deposited to form the electrodes 14a, 14b.

The magnetic film 12 on the glass substrate was arranged on a thermally-conductive plate 60 placed on a Peltier element, and was put into a vacuum chamber 62. As an external magnetic field generation magnet 65 and the longitudinal bias magnetic field addition magnet 20, electromagnets were arranged on the outside of the vacuum chamber 62. For the terminal voltages 14a, 14b of the magnetic film 12, the resistance value was measured with a digital multi-meter 64.

The temperature of the thermally-conductive plate 60 was measured and recorded with a data logger. The temperature of the thermally-conductive plate 60 was adopted as the temperature of the magnetic film 12. In the measurement, first, the inside of the vacuum chamber was depressurized to 0.1 atmospheres, the temperature of the thermally-conductive plate 60 was changed by the Peltier element, and the temperature of the magnetic film 12 was changed. After confirming by the measured temperature that the temperature of the thermally-conductive plate became stable and applying a predetermined longitudinal bias magnetic field by the longitudinal bias magnetic field addition magnet 20, the external magnetic field to be applied to the magnetic film 12 was changed by the external magnetic field generation magnet 65, and therewith, the electric resistance value was measured with the digital multi-meter 64.

By this measurement, it was possible to obtain a graph of the magnetoresistance effect for predetermined temperatures and predetermined longitudinal bias magnetic fields. In the obtained graph of the magnetoresistance effect, a point where the resistance value was half the peak value was adopted as the operating point Hp, and the slope (Ω/Oe) at the operating point Hp was determined. The sensitivity was expressed by the unit of "%/(A/m)", by standardizing the slope by the resistance value at the peak value and converting the magnetic field into the SI unit system (A/m).

Figure 16:
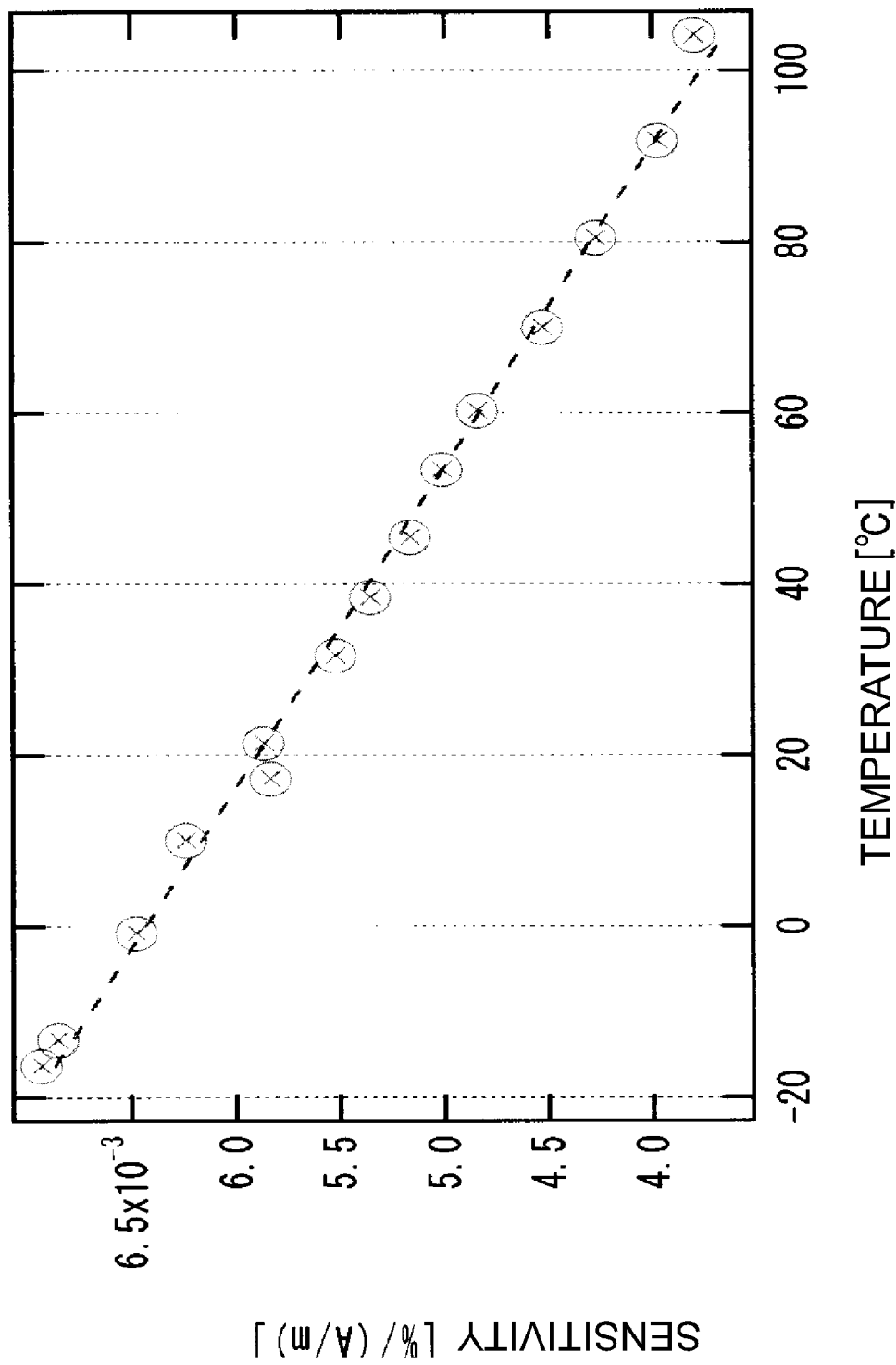
FIG. 16 is a diagram showing an experimental result that shows the relation between the sensitivity and temperature of a magnetoresistance effect element.

FIG. 16 shows the measurement result. The abscissa indicates the temperature (° C.) of the magnetic film 12, and the ordinate indicates the sensitivity (%/(A/m)). As the temperature of the magnetic film 12 rose, the sensitivity decreased linearly.

Figure 17:
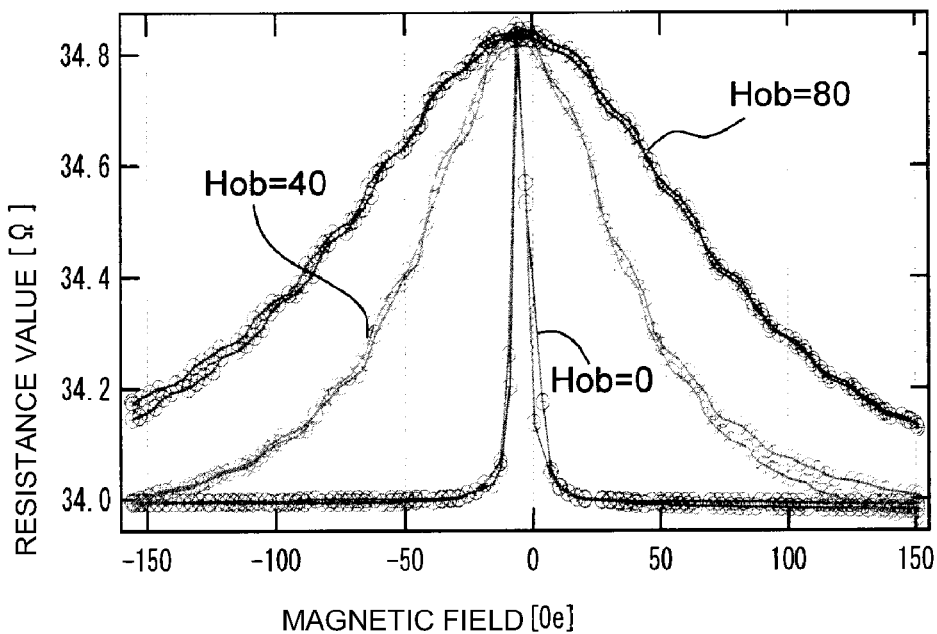
FIG. 17 are diagrams showing the change in sensitivity when the longitudinal bias magnetic field changes.
Figure 17:
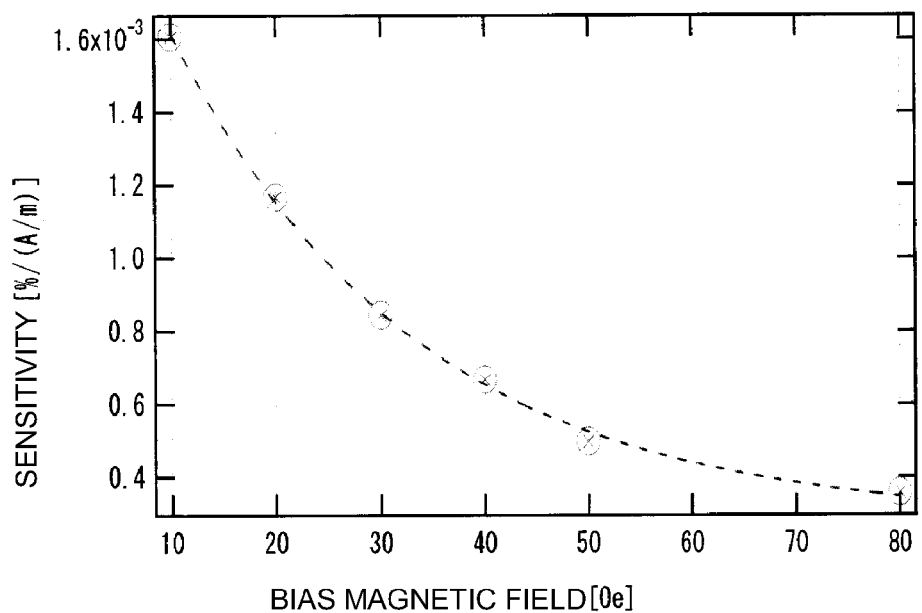

Next, the temperature of the magnetic film was kept constant at 25° C., the longitudinal bias magnetic field was changed, and therewith, the magnetic characteristic effect was measured. FIG. 17 show the result. FIG. 17(a) shows an example of the measurement result of the magnetoresistance effect. The abscissa indicates the intensity (Oe) of the external magnetic field, and the ordinate indicates the resistance value (Ω) between both ends of the magnetic film 12.

As the longitudinal bias magnetic field Hob was changed to 0, 40 and 80 (Oe), the shape of the magnetoresistance effect changed greatly. FIG. 17(b) shows the relation between the longitudinal bias magnetic field and the sensitivity. The abscissa indicates the longitudinal bias magnetic field (Oe), and the ordinate indicates the sensitivity (%/(A/m)). With respect to the intensity of the longitudinal bias magnetic field, the sensitivity changed exponentially.

From these, it was confirmed that the sensitivity of the magnetic film 12 decreased as the temperature rose, and rose as the longitudinal bias magnetic field decreased (due to the rise in the temperature). Further, it was confirmed that the degree of the decrease in the sensitivity due to the temperature characteristic of the magnetic film 12 itself was in a linear manner while the degree of the rise in the sensitivity due to the decrease in the longitudinal bias magnetic field was in an exponential manner.

Figure 18:
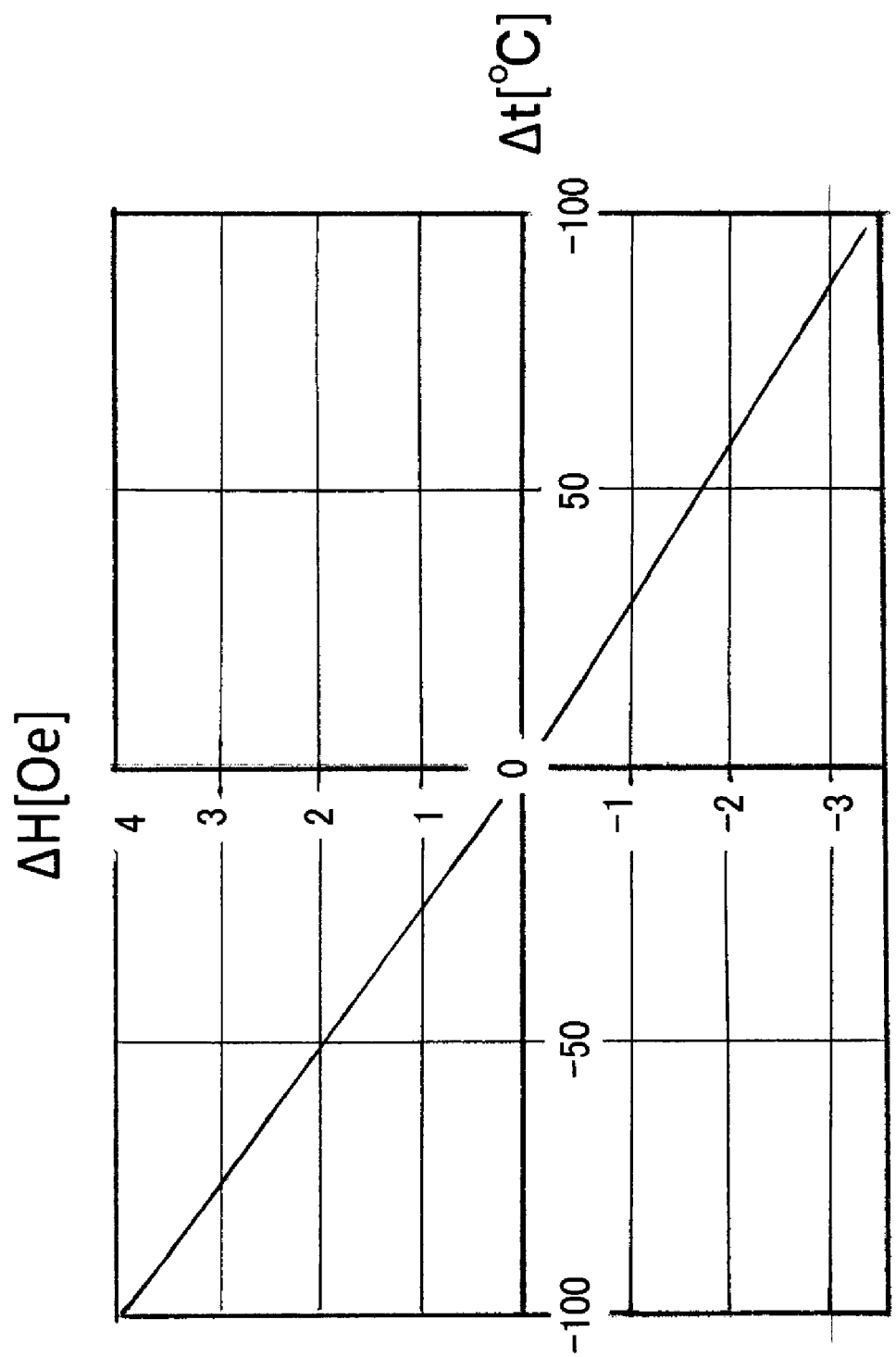
FIG. 18 is a diagram showing the change amount of the longitudinal bias magnetic field that is required when the temperature compensation is performed, with respect to the temperature.

FIG. 18 shows a graph in which the change in the longitudinal bias magnetic field necessary to keep the sensor sensitivity constant was calculated based on the above result. The abscissa indicates the temperature change amount Δt (° C.) from room temperature, and the ordinate indicates the longitudinal bias magnetic field ΔH (Oe). In the range of ±100° C. from room temperature, the longitudinal bias magnetic field was required to change by about ±4 (Oe). Here, it was assumed that, at the origin of the graph, a magnetic field of 40 Oe was applied as the longitudinal bias magnetic field at room temperature (20° C.).

From the result in FIG. 18, at −20° C., the temperature compensation can be performed by the application of a longitudinal bias magnetic field of 40.75 (Oe), and at 120° C., the temperature compensation can be performed by the application of a longitudinal bias magnetic field of 36.5 (Oe). Based on this, the temperature compensation was actually confirmed.

Figure 19:
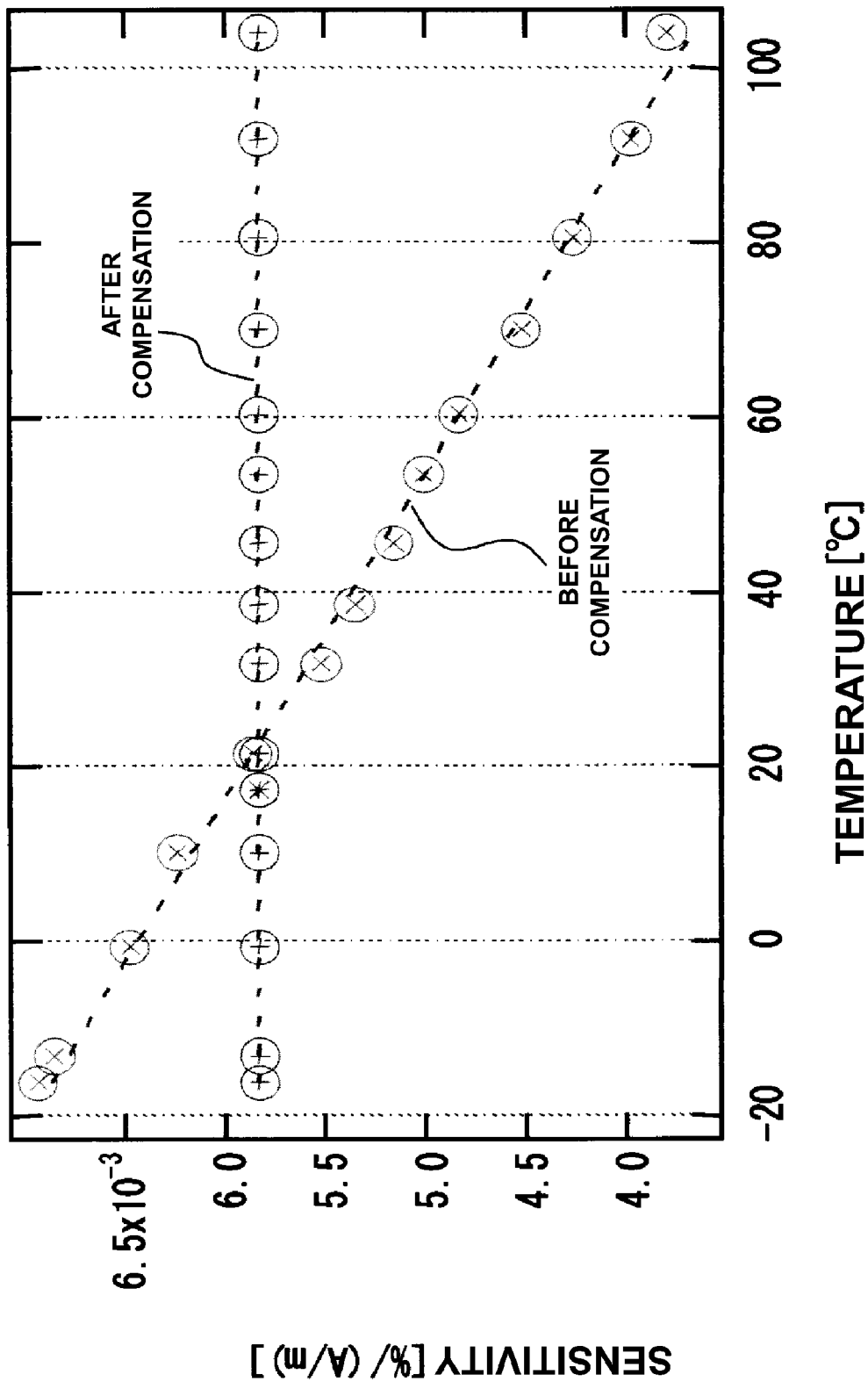
FIG. 19 is a graph showing an experimental result in the case of actually measuring the temperature compensation.

FIG. 19 shows the measurement result. The abscissa indicates the temperature of the magnetic film, and the ordinate indicates the sensitivity (%/(A/m)). By applying the longitudinal bias magnetic field for the compensation determined in FIG. 18 to the magnetic film 12 having the characteristic shown in FIG. 16, it was possible to make the temperature characteristic for the sensitivity become nearly zero. That is, it was confirmed that the sensitivity changed by the temperature was compensated by the alteration of the longitudinal bias magnetic field.

Figure 20:
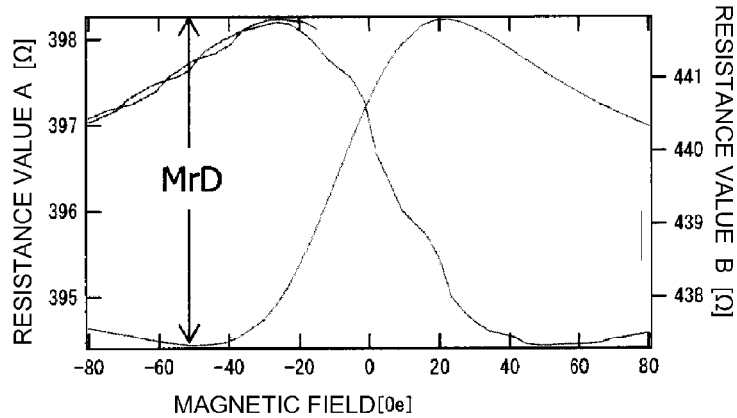
FIG. 20 are graphs showing results in the case of arranging a pair of sensor elements using the oblique bias magnetic field symmetrically with respect to the oblique bias magnetic field and examining the movement of an operating point when the angle is changed.
Figure 20:
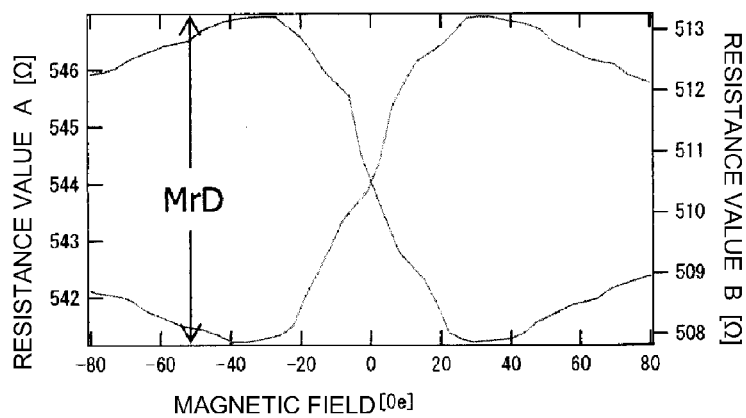
Figure 20:
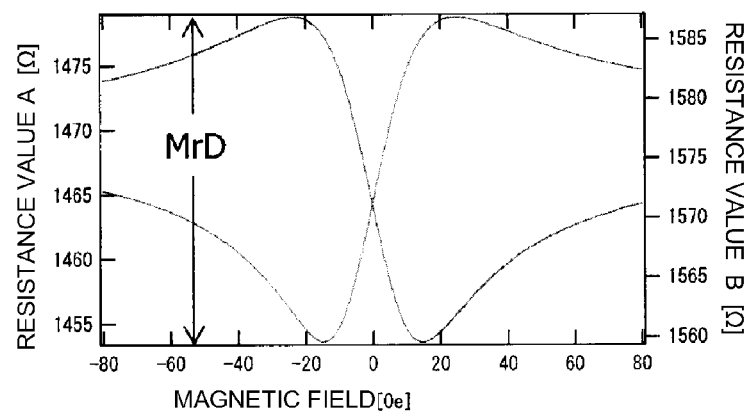

FIG. 20 show measurement results of the magnetoresistance effect for the sensor element 13 of the type shown in FIG. 10(b). In the made sensor element 13, as the first magnetic film 12 and the second magnetic film 42, a sputtering film of permalloy was formed on a glass substrate such that the film thickness was a thickness of 0.3 μm. This was formed as shown in FIG. 10(b). In more detail, the length MrL of the magnetic film 12 was 400 μm, and the width MrW was 20 μm. The first magnetic film 12 and the second magnetic film 42 both had a shape in which 17 magnetic films were connected in series.

Here, as the angle (φ in FIG. 10(a)) to the oblique bias magnetic field, three kinds of 35, 45 and 55 degrees were made. With reference to FIGS. 20(a) to 20(c), the abscissa indicates the external magnetic field intensity H (Oe) in the orthogonal direction to the oblique bias magnetic field, and the ordinate indicates the resistance (Ω) between the electrodes 14a, 14b. At the time of the measurement, the longitudinal bias magnetic field was 25 (Oe), and the temperature was 25° C.

Each graph shows the measurement results of the magnetoresistance effect by the first magnetic film 12 and the magnetoresistance effect by the second magnetic film 42. It was found that the first magnetic film 12 was biased in the minus direction while the second magnetic film 42 was biased in the plus direction. Each conjunction point (the point when the external magnetic field is zero) was high when the angle φ was small, and was low when the angle was large. At just 45 degrees, the conjunction point was at an intermediate position in the whole range MrD of the magnetoresistance effect. That is, it was found that the conjunction point was changed with respect to the amplitude of the magnetoresistance effect.

INDUSTRIAL APPLICABILITY

The magnetic sensor according to the present invention can maintain a stable accuracy, even when the temperature of the use environment changes and the magnetoresistance effect of the magnetic element changes. Therefore, the magnetic sensor can be suitably utilized in electric power meters, battery systems and others that are utilized in various locations.

REFERENCE SIGNS LIST 1 magnetic sensor
2, 3 magnetic sensor with a temperature compensating function
4 electric power measuring device
9 power source
10 substrate
12 magnetic film
12a, 12b magnetic film (near a magnetic pole)
12j connecting spot between magnetic films
13 sensor element
14a, 14b electrode
16 current source
18 lateral bias magnetic field addition magnet
18a, 18b magnetic pole
20 longitudinal bias magnetic field addition magnet
20a, 20b magnetic pole
20c thin permanent magnet
20d, 20e temperature-sensitive magnetic substance
22 voltmeter
22A amplifier
22r1, 22r2 resistance
24 electric conductor
24c common electrode
25 amplifier
26 filter
27 voltmeter
30a, 30b connecting terminal
34 sensor resistance
40 oblique bias magnetic field addition magnet
51, 52 bridge resistance
91 power source
92 load
I electric current
M magnetization
Rmr resistance value in the longitudinal direction of the magnetic film
ΔRmr resistance change amount
Htb lateral bias magnetic field
Hob longitudinal bias magnetic field
S dynamic range
Hsb oblique bias magnetic field

What is claimed is:

1. A sensor element comprising:
    a magnetic film having magnetoresistance effect;
    a pair of electrodes for applying an electric current to the magnetic film, the pair of electrodes being opposed across the magnetic film;
    a longitudinal bias magnetic field addition magnet to generate a first bias magnetic field in an opposing direction of the electrodes; and
    a lateral bias magnetic field addition magnet to generate a second bias magnetic field in an orthogonal direction to the longitudinal bias magnetic field addition magnet,
    wherein a magnetic field intensity variation to the temperature variation of the longitudinal bias magnetic field addition magnet is larger than that of the lateral bias magnetic field addition magnet.

2. The sensor element according to claim 1, wherein the lateral bias magnetic field addition magnet is configured by an electric conductor provided on a surface of the magnetic film.

3. The sensor element according to claim 1, wherein the longitudinal bias magnetic field addition magnet is configured by a temperature-sensitive magnetic film.

4. The sensor element according to claim 1, wherein the longitudinal bias magnetic field addition magnet has temperature-sensitive magnetic films arranged at both ends of an N-pole and an S-pole of a permanent magnet, and is arranged adjacent to the magnetic film, the temperature-sensitive magnetic films having the same temperature characteristic.

5. A magnetic sensor to detect a magnetic field, the magnetic sensor comprising:
   the sensor element according to claim 1;
   a current source to apply an electric current between both end electrodes of the sensor element; and
   a voltmeter to measure a voltage between both the end electrodes of the sensor element.

6. A sensor element comprising:
   a magnetic film having magnetoresistance effect;
   a pair of electrodes for applying an electric current to the magnetic film, the pair of electrodes being opposed across the magnetic film; and
   an oblique bias magnetic field addition magnet to generate a bias magnetic field in an oblique direction with respect to a longitudinal direction of the magnetic film, the oblique bias magnetic field addition magnet having a temperature characteristic.

7. The sensor element according to claim 6, comprising a second magnetic film inclined in a reverse direction to the magnetic film, with respect to the bias magnetic field in the oblique direction, the second magnetic film including electrodes for sharing the pair of electrodes such that the magnetic film and the second magnetic film are connected in parallel.

8. The sensor element according to claim 7,
   wherein the second magnetic film is inclined in a reverse direction to the magnetic film, with respect to the bias magnetic field in the oblique direction, at the same angle as an angle between the magnetic film and the bias magnetic field in the oblique direction.

9. A magnetic sensor to detect a magnetic field, the magnetic sensor comprising:
   the sensor element according to claim 7;
   a current source to apply an electric current between both end electrodes of the sensor element; and
   a voltmeter to measure a voltage between both the end electrodes of the sensor element.

10. An electric power measuring device to measure an electric power in a circuit in which a power source and a load are connected by a connecting wire, the electric power being consumed in the load, the electric power measuring device comprising:
    the sensor element according to claim 1, the sensor element being arranged adjacent to the connecting wire;
    a voltmeter to measure a voltage between both ends of the sensor element;
    a sensor resistance having one end connected with one end of the sensor element; and
    a first connecting terminal and a second connecting terminal for connecting the sensor element in parallel with the load with respect to the power source, the first connecting terminal being provided at the other end of the sensor element, the second connecting terminal being provided at the other end of the sensor resistance.

* * * * *